(12) United States Patent
Kuwabara

(10) Patent No.: US 7,291,970 B2
(45) Date of Patent: Nov. 6, 2007

(54) LIGHT-EMITTING APPARATUS WITH IMPROVED BANK STRUCTURE

(75) Inventor: Hideaki Kuwabara, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 19 days.

(21) Appl. No.: 10/659,427

(22) Filed: Sep. 11, 2003

(65) Prior Publication Data

US 2005/0057151 A1 Mar. 17, 2005

(30) Foreign Application Priority Data

Sep. 11, 2002 (JP) ............................. 2002-265023

(51) Int. Cl.
*H01J 1/62* (2006.01)
(52) U.S. Cl. ...................... 313/504; 313/506
(58) Field of Classification Search ................ 313/504, 313/505, 506, 509
See application file for complete search history.

(56) References Cited

U.S. PATENT DOCUMENTS

| | | | |
|---|---|---|---|
| 4,891,334 A | 1/1990 | Satoh et al. | |
| 5,447,824 A | 9/1995 | Mutsaers et al. | |
| 5,550,066 A | 8/1996 | Tang et al. | |
| 5,669,979 A | 9/1997 | Elliott et al. | |
| 5,853,904 A | 12/1998 | Hall et al. | |
| 5,853,905 A | 12/1998 | So et al. | |
| 5,929,474 A | 7/1999 | Huang et al. | |
| 5,929,561 A | 7/1999 | Kawami et al. | |
| 6,120,584 A | 9/2000 | Sakata et al. | |
| 6,150,668 A | 11/2000 | Bao et al. | |
| 6,187,684 B1 | 2/2001 | Farber et al. | |
| 6,218,206 B1 | 4/2001 | Inoue et al. | |
| 6,246,179 B1 | 6/2001 | Yamada | |
| 6,308,369 B1 | 10/2001 | Garcia et al. | |
| 6,420,834 B2 | 7/2002 | Yamazaki et al. | |

(Continued)

FOREIGN PATENT DOCUMENTS

EP 0 862 156 A1 9/1998

(Continued)

OTHER PUBLICATIONS

International Search Report Dated Feb. 10, 2004.

(Continued)

*Primary Examiner*—Vip Patel
(74) *Attorney, Agent, or Firm*—Nixon Peabody LLP; Jeffrey Costellia

(57) ABSTRACT

Conventionally, there are problems that high resolution is difficult to be achieved since an extreme narrow width bank can not be formed and an aperture ratio as a light-emitting device is low. In addition, there is a threat of electrostatic discharge damage or adhesion of dust during the transportation of a substrate provided with an anode into the equipment for depositing EL material. In view of the foregoing, a first bank formed of an inorganic insulating film is formed, and an insulating film is formed thereon, then, a second bank in contact with a side face of the first bank by carrying out etch back, and then, a side wall bank is formed. For preventing electrostatic discharge damage, an antistatic layer is formed, and the substrate is transported, then, the antistatic layer is removed to form the second bank.

39 Claims, 19 Drawing Sheets

U.S. PATENT DOCUMENTS

| | | |
|---|---|---|
| 6,489,631 B2 | 12/2002 | Young et al. |
| 6,555,968 B2 | 4/2003 | Yamazaki et al. |
| 6,593,691 B2 | 7/2003 | Nishi et al. |
| 6,781,162 B2 | 8/2004 | Yamazaki et al. |
| 6,783,208 B2 | 8/2004 | Kawase et al. |
| 6,798,132 B2 | 9/2004 | Satake |
| 6,812,637 B2 | 11/2004 | Cok et al. |
| 6,828,727 B2 | 12/2004 | Yamazaki |
| 7,042,024 B2 | 5/2006 | Yamazaki et al. |
| 2001/0041270 A1 | 11/2001 | Maruyama et al. |
| 2001/0043046 A1 | 11/2001 | Fukunaga |
| 2002/0018153 A1 | 2/2002 | Kitabayashi |
| 2002/0024493 A1 | 2/2002 | Ozawa et al. |
| 2002/0056842 A1 | 5/2002 | Yamazaki |
| 2002/0066902 A1 | 6/2002 | Takatoku |
| 2002/0071995 A1 | 6/2002 | Montgomery et al. |
| 2002/0075422 A1 | 6/2002 | Kimura et al. |
| 2002/0081503 A1 | 6/2002 | Kawase et al. |
| 2002/0110940 A1 | 8/2002 | Yamagata et al. |
| 2002/0113248 A1 | 8/2002 | Yamagata et al. |
| 2002/0158835 A1* | 10/2002 | Kobayashi et al. ......... 345/100 |
| 2003/0137242 A1* | 7/2003 | Seki ........................... 313/506 |
| 2003/0184217 A1* | 10/2003 | Yamazaki et al. .......... 313/505 |
| 2003/0201443 A1 | 10/2003 | Yamagata et al. |
| 2003/0227021 A1* | 12/2003 | Yamazaki et al. ............. 257/83 |
| 2003/0230967 A1 | 12/2003 | Kawamura et al. |
| 2004/0003939 A1 | 1/2004 | Nishi et al. |
| 2005/0003283 A1 | 1/2005 | Kawase et al. |
| 2005/0012105 A1 | 1/2005 | Yamazaki et al. |
| 2005/0073243 A1 | 4/2005 | Yamazaki et al. |
| 2005/0170076 A1* | 8/2005 | Seki et al. .................... 427/66 |

FOREIGN PATENT DOCUMENTS

| | | |
|---|---|---|
| EP | 0 962 984 A2 | 12/1999 |
| EP | 0 993 235 A2 | 4/2000 |
| EP | 1219980 A2 | 7/2002 |
| EP | 1 338 431 A2 | 8/2003 |
| JP | 09-245965 | 9/1997 |
| JP | 10-189252 | 7/1998 |
| JP | 11-224781 | 8/1999 |
| JP | 11-271753 | 10/1999 |
| JP | 2001-254169 | 9/2001 |
| JP | 2001-345179 | 12/2001 |
| JP | 2002-208477 | 7/2002 |
| JP | 2002-231445 | 8/2002 |
| JP | 2002-250811 | 9/2002 |
| JP | 2002-250881 | 9/2002 |
| JP | 2002-318553 | 10/2002 |
| JP | 2002-318556 | 10/2002 |
| JP | 2002-334790 | 11/2002 |
| JP | 2003-332055 | 11/2003 |
| JP | 2003-347048 | 12/2003 |
| WO | WO 98/12689 | 3/1998 |
| WO | WO-99-48338 | 9/1999 |

OTHER PUBLICATIONS

Miyashita S. et al., "*Full Color Displays Fabricated by Ink-Jet Printing*", Asia /Display / IDW 2001, pp. 1399-1402.

(Written Opinion) Application No. PCT/JP03/11608; filed Sep. 11, 2003 (Dated: Nov. 2, 2004).

International Search Report for PCT Application No. PCT/JP2003/011608, dated Feb. 10, 2004.

* cited by examiner

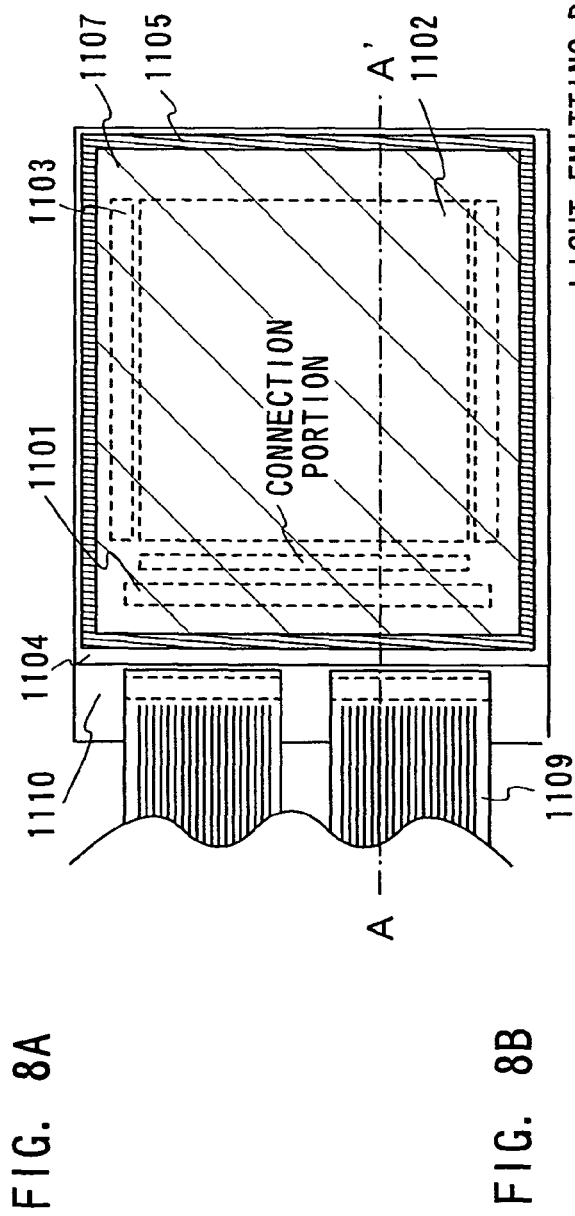
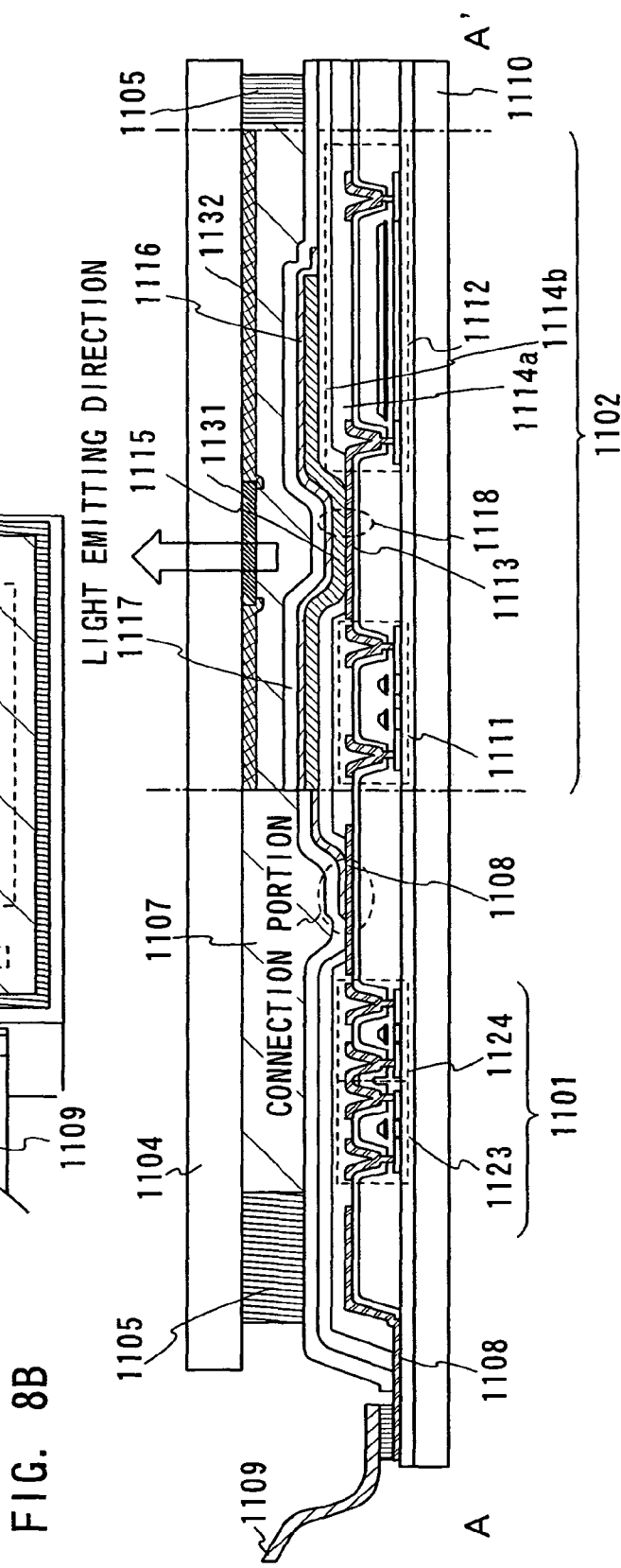
FIG. 8A
FIG. 8B

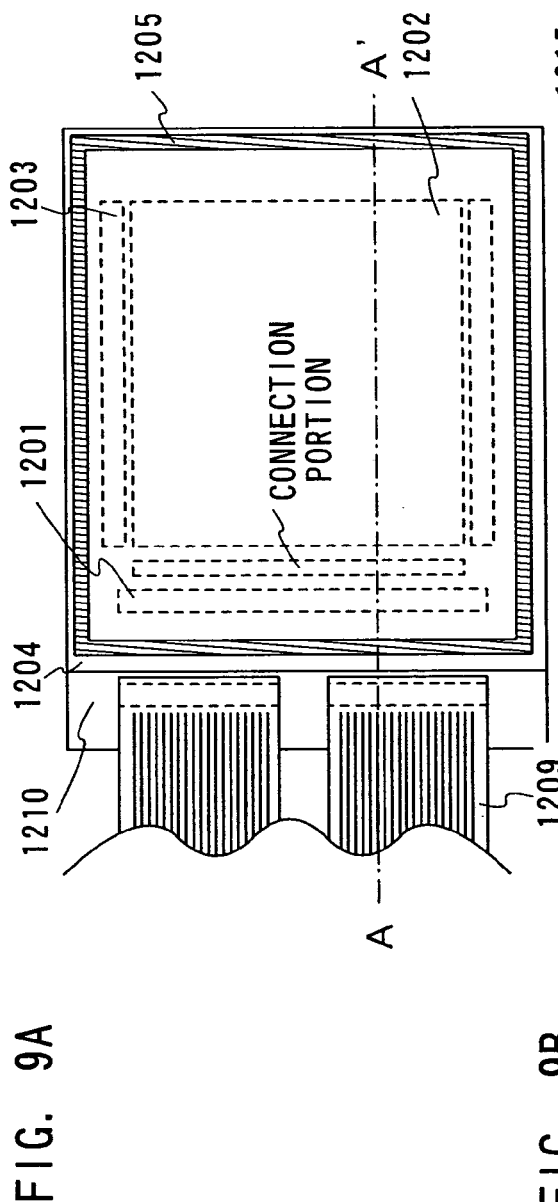
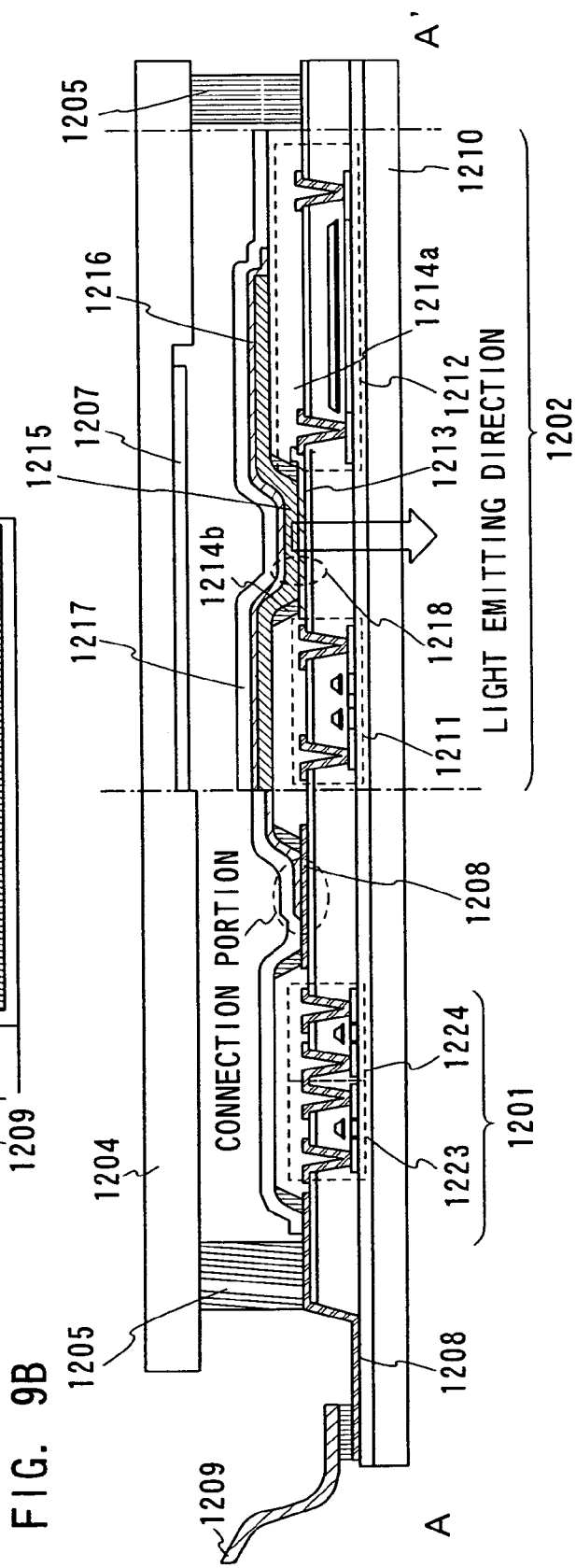
FIG. 9A
FIG. 9B

LIGHT-EMITTING APPARATUS WITH IMPROVED BANK STRUCTURE

BACKGROUND OF THE INVENTION

1. Field of the Invention

The present invention relates to a light-emitting apparatus comprising a light-emitting device that emits fluorescence or phosphoresce upon application of an electric field thereto and includes a pair of electrodes and a film containing an organic compound (hereinafter, an organic compound layer) that is sandwiched between the pair of electrodes, and to a method of fabricating the light-emitting apparatus. In this specification, the term "light-emitting apparatus" includes an image display apparatus, a light-emitting device, or a light source (including a lighting system). Also, the following modules are included in the light-emitting apparatus: a module obtained by attaching a connector such as an FPC (flexible printed circuit), a TAB (tape automated bonding) tape, or a TCP (tape carrier package) to a light-emitting device; a module obtained by providing a PWB (printed wiring board) with a tip of a TAB tape or a TCP; and a module obtained by mounting directly an IC (integrated circuit) to a light-emitting device by the COG (chip on glass) system.

2. Description of the Related Art

A light-emitting device using an organic compound as a luminous body, which is characterized by its thinness and light-weight, fast response, direct current low voltage driving, and so on is expected to be applied to next-generation flat panel displays. Particularly, a light-emitting apparatus in which light-emitting devices are arranged in a matrix configuration is considered to be superior to the conventional liquid crystal display devices for its wide viewable angle and excellent visibility.

The luminescent mechanism of a light-emitting device is as follows: an electric field is applied to a pair of electrodes that sandwich an organic compound layer, and electrons injected from a cathode and holes injected from an anode are re-combined at the luminescent center of the organic compound layer to form molecular excitons, and then the molecular excitons revert to a ground state while radiating energy, consequently, luminescence radiation takes place in the organic compound layer. Known excitation states are an excited singlet state and an excited triplet state whose electronic level is made up of many vibrational and rotational levels. The luminescence radiation is allowed to take place by reverting from either state to the ground state.

A light-emitting device constructed of a plurality of light-emitting devices being arranged in a matrix configuration may be operated by one of well-known driving systems such as a passive matrix drive and an active matrix drive. However, when a pixel density increases, it may be preferable to use an active matrix type system in which a switch is provided in every pixel (or every dot) because it can be driven at a low voltage.

In case of forming an active matrix type light-emitting apparatus, a thin film transistor (TFT) is formed over a substrate having an insulating surface as a switching element and an EL device that comprises a pixel electrode connected electrically to the TFT as an anode and a cathode is formed in a matrix configuration.

In a manufacturing factory where a TFT is formed over a substrate having an insulating surface and a manufacturing factory where an integrated circuit is formed over a semiconductor substrate, a manufacturer pays an attention to keep the factory in high cleanliness and to prevent impurities from being mixed into a delicate device. Particularly, they pay an attention to prevent an alkali metal element that gives a semiconductor device an adverse effect.

On the other hand, for forming an EL device, it is preferable that a small function material is used as a cathode, especially, an alkali metal element is proper, and it is necessary to form an organic compound layer as a light-emitting layer.

Therefore in case of fabricating a TFT and an EL element over a substrate, a possible solution to the problem of contamination is to separate a installation site of an equipment for fabricating a TFT from an installation site of an equipment for fabricating an EL device. For example, using different purifiers by providing partition between devices, separating buildings in which the equipment are installed, or separating a factory itself can be considered.

In case of separating equipment, a problem will arise that substrates should be transported between the installation sites, and there is a risk of electrostatic discharge damage and adhesion of dust on a substrate during transportation of the substrates.

Further, since a substrate, an organic insulating film, and an inorganic insulating film are insulators, static electricity easily charges their surfaces. Due to this, there is a threat of adhesion of dust on the charged-surface or generating electrostatic discharge if the substrate, the organic insulating film, and the inorganic insulating film come into contact with another object.

Since an organic compound layer serving as a light-emitting layer has a thin film thickness, poor coverage easily occurs due to large irregularities of the surface, that is, large difference in level is produced.

SUMMARY OF THE INVENTION

The present invention relates to forming a bank having a novel structure to solve the above-mentioned problems. Particularly, the present invention, as one example thereof shown in FIG. 1B, relates to a light-emitting apparatus including a light-emitting device having a first electrode, an organic compound layer, and a second electrode over a substrate having an insulating surface, comprising a first bank covering an edge portion of the first electrode, and a second bank serving as a side wall of the first bank.

According to the above-mentioned structure, when an upper portion of the first bank is formed to be narrow, poor coverage can be reduced by the second bank. In order that an active matrix display device or a passive matrix display device have high resolution, upper portions of the banks also need to be reduced. In case that dry etching is carried out when the first bank is formed of an inorganic insulating film or a nonphotosensitive resin, though high resolution can be achieved, a side face of the first bank is made rough or the angle between the side face and a substrate (taper angle) is made too large. In view of the foregoing, the second bank covering both side faces of the first bank is formed to cover the rough portions of the both side faces and to form a smooth surface.

As materials for the first bank and the second bank, inorganic materials formed by sputtering, PCVD, or coating (silicon oxide, silicon nitride, silicon oxynitride, SiOF film, SiONF film, or the like), photosensitive organic materials or nonphotosensitive organic materials formed by coating (polyimide, acrylic, polyamide, polyimideamide, resist, or benzocyclobutene), a SOG film formed by coating (an insulating film having a siloxane structure), or a lamination layer of these materials can be appropriately used. Either a negative type that become an insoluble material in etchant according to light to which photosensitive material is exposed (hereinafter written as light for photosensitive material) or a positive type that become dissoluble in etchant according to light for photosensitive material can be used as an insulator. When an insulation performance of the second bank is low, it is not a significant problem since the interelectrodes can be insulated by only the first bank. As another material for the second bank, semiconductor materials (including doped semiconductor materials) can be used.

Although the first bank and the second bank may be formed of same materials, it is preferable to use different materials for the first bank and the second bank. In case that an organic compound layer is formed by vapor deposition, it is preferable that the thickness of the first bank be formed to be not more than 1 μm (more preferably, from 0.5 to 1 μm) to prevent the wrap-around of the vapor deposition, since an evaporation mask and the first bank are in contact with each other. Since it is difficult to form a thin film using an organic material, it is preferable to use an inorganic material. In case that a bank is formed of photosensitive resin by exposure, an upper portion is formed to have a curved surface, and a bottom has a width (width of a side of the bank) of 5 μm, or greater than that, which is spread than the upper portion. Consequently, the bank has not less than 10 μm in the width in total, and an aperture ratio is reduced accordingly. According to the present invention, a narrow width bank can be formed, for example, a first bank of 1 μm in width and a second bank of 1 μm in width can be formed to be a 3 μm in width of the banks in total. The width of the second bank may be 0.1 μm, or larger than that, and it is preferable to be larger than the height of the first bank. The width of the second bank may be enough to be about 3 μm to keep sufficient coverage. The reliability of a light-emitting device as a whole is improved by keeping coverage of an organic compound layer and a film formed thereon. The radius of curvature of the upper portion of the second bank may be from 0.5 μm to 2 μm.

Utilization of an inorganic material for a part of a bank is resulted in reducing total amount of degasification comparing to a bank formed from only an organic material. In addition, the treatment time spent on vacuum baking for degasification carried out before vapor deposition of an organic compound layer can be reduced during a process. Since amount of degasification after sealing the light-emitting device is a little bit, the long reliability of the light-emitting apparatus can be increased.

The present invention can be applied to either of an active matrix display device or a passive matrix display device, particularly, the present invention is useful for a bottom emitting type active matrix display device in which an aperture ratio, that is, a luminous area tends to be lowered depending on a TFT or another wirings.

It is possible to insulate interelectrode by the second bank instead of the first bank. For example, it is possible that a first bank is formed to cover an edge portion of the electrode of a TFT and a second bank is formed to cover a difference in level of the region where the electrode of the TFT and a first electrode are overlapped.

In case that an organic compound layer is formed by coating such as ink-jetting or spin-coating, as one of the example shown in FIG. 1B, it is preferable that a material for a second bank be a hydrophilic material (polyacrylamide, polyvinyl alcohol, polyvinyl pyrrolidone, MSQ (methylsilsesiloxane), silicon oxide, aluminum oxide, carbon doped silicon oxide (SiOC), or the like), and a material for a first bank be a hydrophobic material (polyvinylchloride, polyurethane, epoxy resin, silicon resin, silicon nitride, polysilicon, amorphous silicon, or the like). Consequently, an organic compound layer is not formed on the first bank, and can be selectively formed to be contact with either of the first electrode or the second bank. Here, an example in which a material for a second bank is a hydrophilic material that uses water as a solvent and a material for a first bank is a hydrophobic material that uses water as a solvent is described. In case of using a material solution for an organic compound layer other than water as a solvent, a material having an affinity for the solvent may be used for the second bank and a material having no affinity for the solvent may be used for the first bank.

It is possible to carry out $O_2$ plasma treatment or $N_2O$ plasma treatment as a hydrophilic treatment for a material surface having a hydrophobic property. A hydrophilic treatment can be carried out by surface dip treatment with solution using alcohol containing hydroxyl group (—OH) as a solvent. CMP (Chemical Mechanical Polishing) treatment is a surface polishing method by using slurry. The slurry is a suspension that is prepared by suspending particles such as $SiO_2$ in chemical solution such as KOH, $NH_4OH$ or the like. Consequently, the CMP treatment plays a roll of hydrophilic treatment as well as planarization.

As a hydrophobic treatment, plasma treatment may be carried out to a materials surface having a hydrophilic property using gas such as $SiH_4$, $SiH_mF_n$, fluorocarbon, or the like.

In case that coverage of a film (an organic compound layer, or the like) formed over an upper portion of a bank is not required, a side face of a second bank 1612 may be formed to have a taper shaped as shown in FIG. 15A, and as shown in FIG. 15B, a side face of a second bank 1622 may be formed to have a curved slope for a material solution being easily pooled in the curved slope.

A material for a second bank may be contained pigments for absorbing light emission generated in an organic compound layer or an outside light. A second bank is black in case of using carbon doped silicon oxide (SiOC) as the material for the second bank.

The structure according to the present invention relating to a fabrication method disclosed in this specification is a fabrication method for a light-emitting apparatus including a light-emitting device having a first electrode, an organic compound layer, and a second electrode over a substrate having an insulating surface, comprising steps of forming a TFT and the first electrode over the substrate, forming a first bank having a hydrophobic surface with covering an edge portion of the first electrode, forming a second bank having a hydrophilic surface on a side face of the first bank, and forming the organic compound layer in contact with only the second bank and the first electrode by coating.

Further, a first bank may be covered with a second bank. As shown in FIG. 4A, a light-emitting apparatus including a light-emitting device having a first electrode, an organic compound layer, and a second electrode over a substrate having an insulating surface, comprising a first bank covering an edge portion of the first electrode, a second bank covering the first bank, the organic compound layer formed over the first electrode, and the second electrode formed over the organic compound layer, wherein the second bank is provided between the organic compound layer and the first bank.

In the above-mentioned structure, the first bank is completely covered with the second bank, and an upper edge portion of the second bank is more rounded than that of the first bank. According to the structure, the poor coverage may be reduced by the second bank even if the upper surface shape of the first bank is formed to be narrow.

In case that a TFT and an EL device are fabricated over a substrate, a possible solution to a problem of contamination is to separate an installation site of equipment for fabricating a TFT and an installation site of equipment for fabricating an EL device. When transporting a substrate between these installation sites, it is preferable that a whole surface of the substrate be covered completely with an insulating film as a first bank.

A structure relating to a fabrication method according to the present invention is a fabrication method for a light-emitting apparatus including a light-emitting device having a first electrode, an organic compound layer, and a second electrode over a substrate having an insulating surface, comprising steps of forming a TFT and the first electrode over the substrate and forming an organic resin film or an inorganic insulating film with covering the first electrode over a whole surface at a first installation site, transporting the substrate into a second installation site, forming a bank by etching the organic resin film or the inorganic insulating film and forming the organic compound layer over the first electrode without exposing to the air after exposing a part of the first electrode at the second installation site, and forming the second electrode over the organic compound layer.

In addition, it is preferable that an antistatic layer for covering the organic resin film or the inorganic insulating film be formed before transporting the substrate into the second installation side for preventing electrostatic discharge damage.

Further, a first electrode surface may be polished or washed after forming a first bank. Another structure relating to the fabrication method according to the present invention is a fabrication method for a light-emitting apparatus including a light-emitting device having a first electrode, an organic compound layer, and a second electrode over a substrate having an insulating surface, comprising steps of forming a TFT and the first electrode over the substrate and forming a first bank covering an edge portion of the first electrode at a first installation site, polishing an exposed portion of the first electrode surface, forming an organic resin film or an inorganic insulating film with covering the first electrode and the first bank over a whole surface, transporting a substrate into a second installation site, forming a second bank by etching the organic resin film or the inorganic insulating film and forming the organic compound layer over the first electrode without exposing to the air after exposing the first electrode at the second installation site, and forming the second electrode over the organic compound layer.

By polishing and washing the first electrode surface, the first electrode surface area except being covered with the first bank becomes flat and cleaned. That is, in each above-mentioned structure, irregularities of the first electrode surface contacting with the organic compound layer are smaller than those of the first electrode surface covered with the first bank. An insulating film is formed to cover a whole surface, and anisotropic etching is carried out on the insulating film, then, the second bank is formed in a self-aligning manner, and then, the first electrode surface is exposed. Although it is possible to use masks for forming the second bank, it is preferable that the second bank be formed by anisotropic etching in a self-aligning manner for preventing the increase in the number of masks.

In case of the first electrode surface is polished by CMP using slurry after forming the first bank, the vicinity of a bottom edge portion of the first bank is not very polished well. However, it matters little whether the vicinity of a bottom edge portion of the first bank is polished well or not since the portion is covered by the second bank in the following process. In each above-mentioned structure, the area in the first electrode contacting with the second bank has smaller irregularities than those of the first electrode surface contacting with the first bank.

In case of a TFT and an EL device are fabricated over a substrate, a possible solution to a problem of contamination is to separate an installation site of an equipment for fabricating the TFT and an installation site of an equipment for fabricating the EL device. When transporting a substrate between the installation sites, it is preferable that the whole surface of the substrate be covered with an insulating film as a second bank. It is possible that refuse is prevented from attaching to a first electrode surface by covering the first electrode surface.

An electrostatic discharge damage can be prevented by forming an antistatic layer that covers an insulting film that serves as a second bank. The another structure relating to a fabrication method according to the present invention is a fabrication method for a light-emitting apparatus including a light-emitting device having a first electrode, an organic compound layer, and a second electrode over a substrate having an insulating surface, comprising steps of forming a TFT and the first electrode over the substrate and forming a lamination layer of an organic resin film or an inorganic insulating film and an antistatic layer with covering the first electrode over a whole surface at a first installation site, transporting a substrate into a second installation site, etching the antistatic layer, forming a bank by etching the organic resin film or the inorganic insulating film, and forming the organic compound layer over the first electrode without exposing to the air after exposing a part of the first electrode at the second installation site, and forming a second electrode over the organic compound layer.

An electrostatic discharge damage can be prevented by forming an antistatic layer that covers an insulating film serving as a second bank. As the antistatic layer, a conductive coated film, for example, a surface-active agent coated film may be utilized. Also, deposited film formed of a material having composition that inorganic salt such as lithium chloride or magnesium chloride is dispersed into film formation material such as synthetic resin or silicate, or deposited film formed of a material having composition that ion-conducting materials such as polymer electrolyte containing a carboxylic acid group or a sulfonic acid group are dispersed into film formation material such as synthetic resin or silicate, or conductive polymer may be utilized as the antistatic layer. After the transportation of the substrate, the antistatic layer is removed, and anisotropic etching is carried out on the insulating film, and then, an organic compound layer is formed.

The present invention can be applied to a top emitting type light-emitting device in which light emission is transmitted through a second electrode. In case of the top emitting type light-emitting device, a transparent conductive film that is transparent to light is used for the second electrode, however, there is a problem that the film resistance of the second electrode is increased. Particularly, in case of forming the transparent conductive film to be thin, the film resistance is further increased. When the film resistance of the transparent conductive film that serves as an anode or a cathode is increased, in-plane potential distribution becomes inhomogeneous due to voltage drop and luminance of a light-emitting device is varied. In view of the foregoing, the present invention provides a light-emitting device that has a structure that reduces a film resistance of a transparent electrode in the light-emitting device.

The structure of the present invention, as shown in FIG. 17A, is that a light-emitting apparatus including a light-emitting device having a first electrode, an organic compound layer, and a second electrode over a substrate having an insulating surface, comprising a first bank covering an edge portion of the first electrode, a second bank serving as a side wall of the first bank, wherein the first bank having a lamination structure comprising a metal layer as an upper layer and an insulating layer as a bottom layer.

In the above structure, the second electrode has a transparent conductive film, and luminescence from the light-emitting device emits through the second electrode.

Further, in the above structure, the metal layer serves as an auxiliary electrode in contact with the second electrode.

As shown in FIG. 17A, an insulating film and a metal film is stacked, and patterning is carried out using a same mask. Consequently, a first bank having the upper layer as a metal layer and the bottom layer as an insulating layer can be formed. Therefore, the number of mask is not increased. The metal layer that is the upper layer of the first bank serves as a supporting electrode 1800.

In the above structure, the metal layer is connected to a bottom wiring via a contact hole provided with the bank.

It is also one of the characteristics of the present invention that the metal layer is connected to another wirings presenting at the bottom by forming a leading out wiring using the metal layer. In this case, one more mask for a contact hole is required because a metal layer is formed after forming the contact hole to the first bank. Therefore a region for connecting a transparent electrode and a connection electrode has been provided in addition to a display region, however, the region can be reduced. In case of using coating for forming an organic compound layer, $O_2$ plasma ashing treatment or the like is selectively carried out for exposing the connection electrode before forming the organic compound layer by vapor deposition or forming a cathode since a film is formed over the whole surface. According to the present invention, an organic compound layer and a cathode can be continuously laminated even if coating is used for forming a film containing an organic compound.

The structure of a TFT can be, but not exclusively, a top gate type TFT having a polysilicon as an active layer or a bottom gate type TFT having a polysilicon as an active layer, and also an amorphous silicon TFT as shown in FIG. 18.

BRIEF DESCRIPTION OF THE DRAWINGS

FIGS. 8A and 8B are a top view and a cross-sectional view, respectively, according to Embodiment 1;

FIGS. 9A and 9B are a top view and a cross-sectional view, respectively according to Embodiment 1;

DESCRIPTION OF THE INVENTION

The embodiment modes of the present invention are described hereinafter.

Embodiment Mode 1

The present invention is described by using an example of an active matrix light-emitting device in this embodiment mode.

Figure 1A:
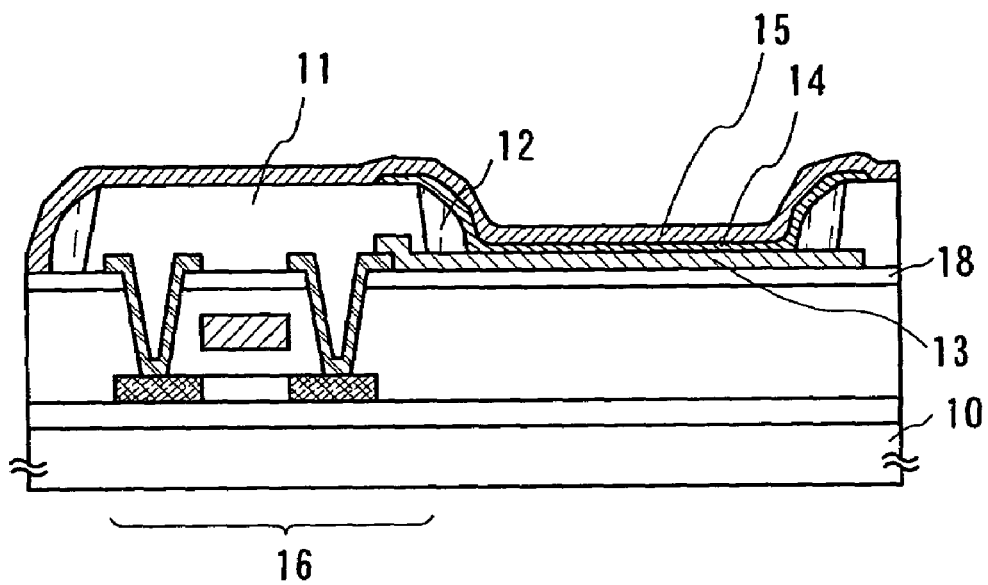
FIGS. 1A and 1B are views showing cross-sectional structures according to Embodiment Mode 1.

In FIG. 1A, reference numeral 10 is a substrate, 11 is a first bank, 12 is a second bank, 13 is a first electrode, 14 is an organic compound layer, 15 is a second electrode, 16 is a TFT, and 18 is an insulating film. In FIG. 1A, the electrode 13 serves as an anode of a light-emitting device and the second electrode serves as a cathode of the light-emitting device, but not exclusively, the first electrode can serve as a cathode and the second electrode can serve as an anode if materials are selected appropriately.

An example of a fabrication process for forming a structure illustrated in FIG. 1A is shown in FIGS. 2A, 2B, 2C and 2D.

The TFT 16 is fabricated over the substrate 10 having an insulating surface. As materials for an interlayer insulating film of the TFT, for example, inorganic materials formed by sputtering, PCVD, or coating (silicon oxide, silicon nitride, silicon oxynitride, SiOF film, SiONF film, or the like), photosensitive organic materials or nonphotosensitive organic materials formed by coating (polyimide, acrylic, polyamide, polyimideamide, resist, or benzocyclobutene), a SOG film formed by coating (an insulating film having a siloxane structure), or a lamination layer of these materials can be appropriately used. A top gate type TFT is illustrated here, but not exclusively, the TFT can be a bottom gate type TFT. The TFT 16 is formed to be an n-channel TFT or a p-channel TFT by a known method. Next, the first electrode 13 that serves as an anode is formed to overlap with a part of the electrode of the TFT. Here, the first electrode 13 is formed of a large work function conductive material (ITO (Indium tin oxide), $In_2O_3$—ZnO (indium oxide zinc oxide alloy), ZnO (zinc oxide), or the like) by wet etching. When the first electrode 13 is patterned, an etching condition or a material is appropriately set so that the first electrode 13 has a high selection ratio of the first electrode 13 to the insulating film 18, that is, a wide difference in an etching rate from that of the insulating film 18.

And then, an insulating film is formed by PCVD, sputtering, or coating over the whole surface, and patterning is carried out to form the first bank 11. The first bank 11 covers an edge portion of the first electrode, wirings, and electrodes, and insulates interelectrode. When a width of the first bank 11 is large, an aperture ratio is decreased. Therefore the present invention increases the aperture ratio, and improves high resolution by forming an upper shape of the first bank into small as possible. It is preferable that patterning be carried out by dry etching that enables to carry out microfabrications. When the first bank 11 is patterned, an etching condition or a material is appropriately set so that the first bank 11 has a wide difference in an etching rate from that of the first electrode 13 and the insulating film 18.

Figure 2A:
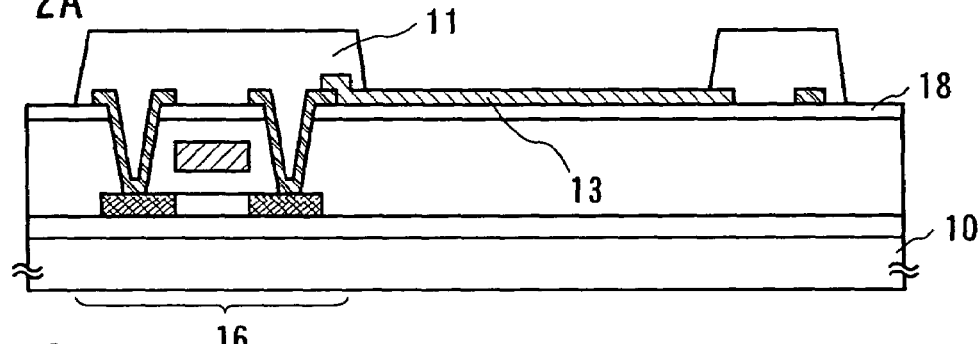
FIGS. 2A to 2D are views showing processes according to Embodiment Mode 1.
Figure 2B:
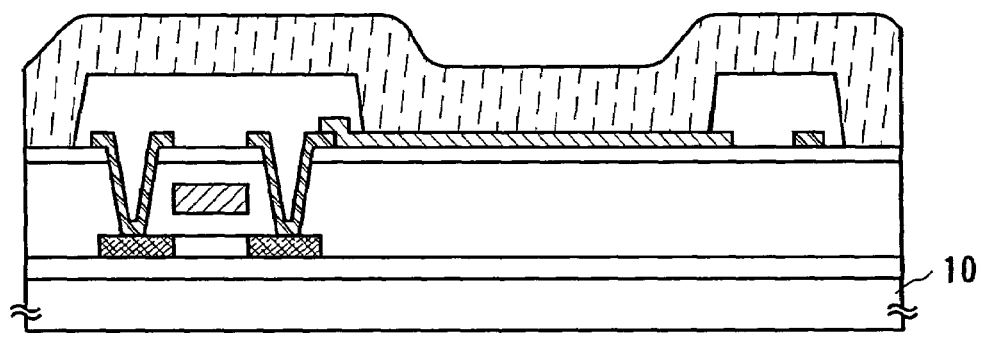
Figure 2C:
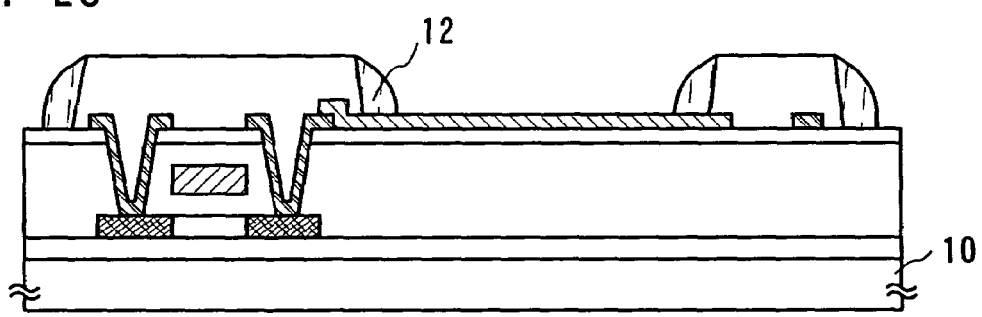
Figure 2D:
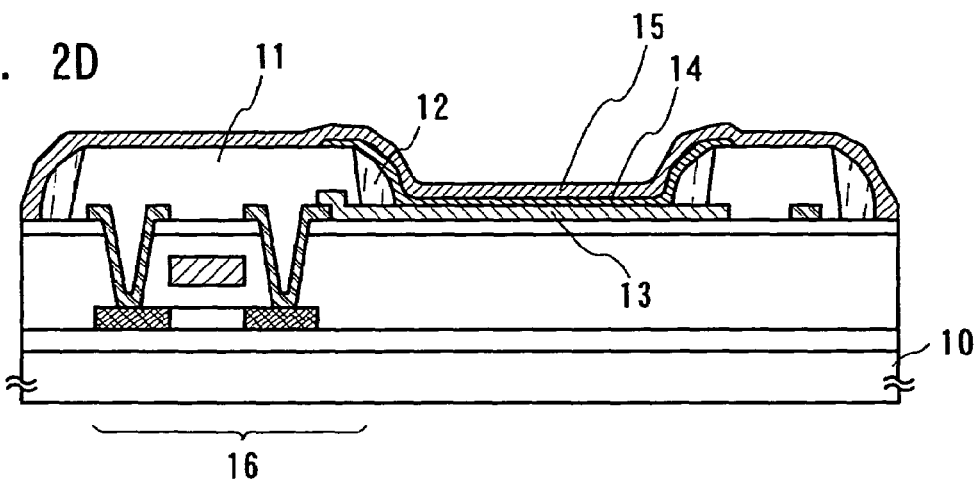

Then, an exposed surface of the first electrode 13 is polished or washed. FIG. 2A is a cross-sectional view of one pixel at this stage. It is preferable to wash a surface of the first electrode (anode) with a porous sponge, typically, made from such as PVA (poly-vinyl alcohol) or nylon and soaked in a surfactant (weak alkaline) to remove refuse on the surface. As a washing mechanism, a washing equipment with a roll brush of PVA that turns an axis in parallel with a face of a substrate to touch a surface of the substrate, or a washing equipment with a disc brush of PVA that turns an axis perpendicular to a face of a substrate to touch a surface of the substrate may be used. For example, in case of using chemical mechanical polishing (CMP), it is preferable that the first bank be formed of a hard inorganic material. Even if the first bank as a projection is provided, a first electrode surface can be polished to be a flat surface. Further, in case that the height (thickness) of the first bank is 2 μm, poor coverage is easily generated, moreover, the periphery of the bottom edge portion of the first bank contacting with the first electrode is difficult to be polished. Thus, the height of the first bank is preferable to be low.

Figure 7A:
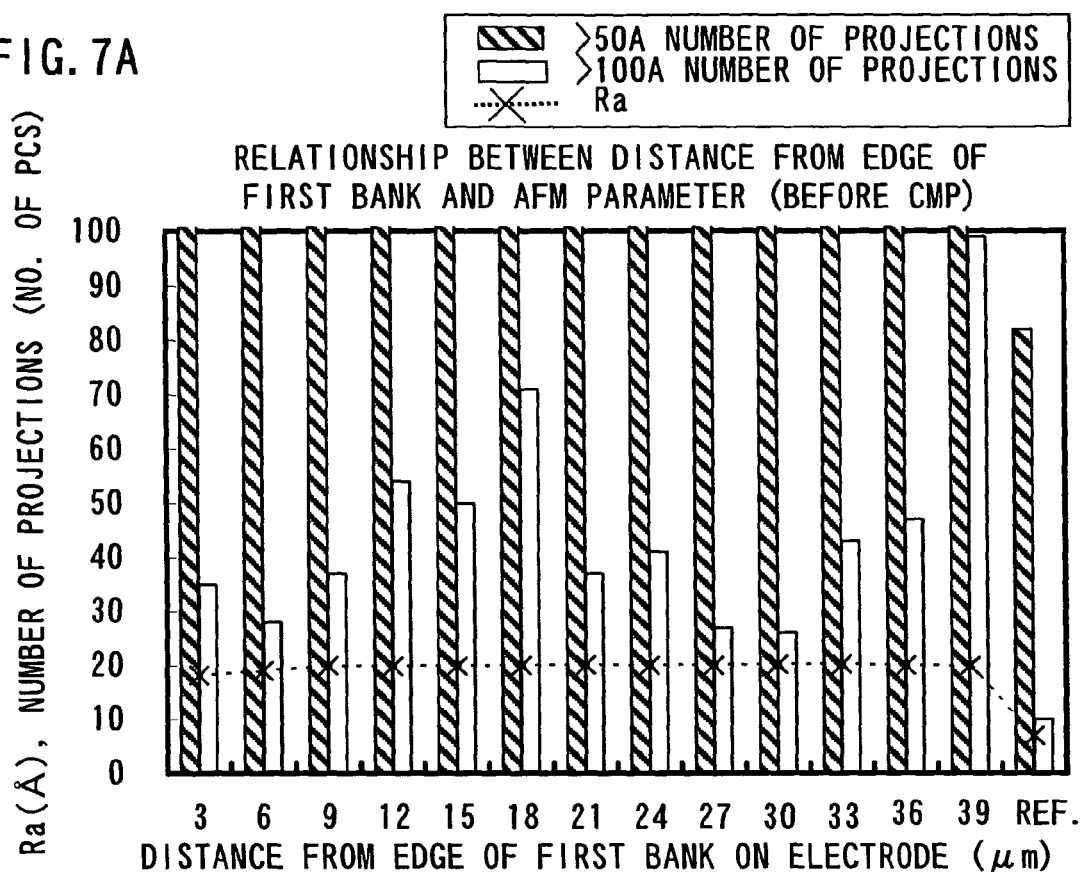
FIGS. 7A and 7B are graph showing the comparison of the amount of irregularities before and after CMP.
Figure 7B:
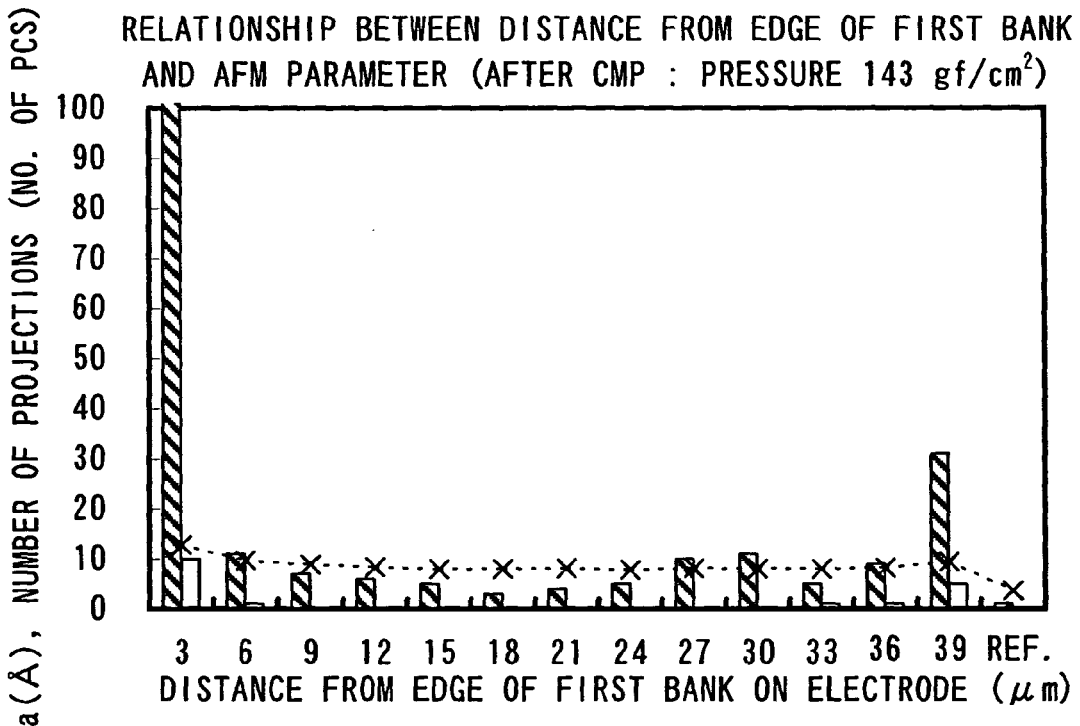

The first electrode 13 is subjected to CMP by a CMP device at a state of having projection of 550 nm in height. A planarization is realized at a portion that is more than 3 μm away from the projection. FIGS. 7A and 7B show the results of the experiments. Irregularities of not less than 10 μm are drastically reduced as shown in FIG. 7B compared with the state shown in FIG. 7A. In FIG. 7A, REF. shows the experimental result showing the irregularities of the surface of the electrode under the condition that a first bank is not formed on the electrode before carrying out CMP on the electrode. In FIG. 7B, REF. shows the experimental result showing the irregularities of the surface of the electrode under the condition that a first bank is not formed on the electrode after carrying out CMP on the electrode.

Another treatment, for example, UV irradiation, oxygen plasma treatment, or the like for the first electrode surface reforming can be carried out after the polishing is carried out.

Next, an insulating film is formed over a whole surface of the substrate. (FIG. 2B) For forming the insulating film, a material that is different in etching rate from the material for the first bank is used. Since the first bank has insulated already between the electrodes, a semiconductor film (polysilicon or amorphous silicon) can be formed instead of the insulating film. The insulating film will serve as a second bank that covers a side face of the first bank in the following process. The insulating film is formed just after polishing the first electrode surface to prevent refusing from attaching to the first electrode surface. In case that refuse is attached to the first electrode surface during transportation or an introduction of the substrate at a state of FIG. 2A into a vapor deposition system, it may cause short circuit. However, when the substrate is formed to be a state shown in FIG. 2B, even when refuse is attached to an insulating film surface, the refuse on the insulating film surface can be removed by etching and the first electrode surface can be kept clean.

The insulating film is almost removed by anisotropic etching or etch back, and the second bank 12 that is in contact with only a side face of the first bank is formed, and simultaneously, the first electrode surface is exposed. (FIG. 2C) It is preferable that the second bank be formed to be a curved surface according to shape of the first bank in a self-aligning manner by wet etching or dry etching using a reactive ion. The first bank side face formed by dry etching is easily to be rough, so that the second bank is formed to cover the rough surface of the first bank side face. As a result, a sidewall type bank is formed. In case that a portion that has not yet been flattened by planarization treatment such as CMP, or the like, are presented on the first electrode surface, the portion can be covered with the second bank. When the second bank 12 is patterned, an etching condition or a material for the second bank is appropriately set for having a high selection ratio of the second bank 12 to the first bank, the first electrode and the insulating film 18, that is, a different etching rate from that of the first bank, the first electrode, and the insulating film 18.

When the second bank is formed, the first electrode surface may be formed to be thin by etching. The first electrode surface can be kept a flat surface even if the surface is somewhat overetched (etched too much) since the surface is flattened by CMP in advance. In case that the first electrode surface is overetched, a slight difference in level is generated at a connecting portion of an edge portion of the second bank.

In addition, when a second bank is formed, a first bank may be etched that is formed of a material having different etching rate from that of the second bank. In case that the first bank is overetched, an upper edge portion thereof can be formed to be round.

An example of combination of materials for each portion is as follows: a silicon nitride film for the insulating film 18; an ITO for the first electrode 13; and an organic resin film (acrylic, polyimide, or the like) for the second bank 12. The second bank is formed by $O_2$ plasma ashing. In case of forming the second bank by $O_2$ plasma ashing, the number of total steps is not increased since the surface reforming of the first electrode 13 can be carried out by $O_2$ plasma ashing. In case that the first electrode is formed of titanium nitride film in the top emitting type display device, it is preferable to increase the work function by changing the gas to gaseous chlorine and carrying out plasma treatment. According to the present invention, vacuum annealing can be carried out without exposing to the air after the bank is formed, moreover, an organic compound layer can be formed.

An another example of combination of materials for each portion is as follows: a silicon nitride film for the insulating film 18; an ITO for the first electrode 13; a silicon oxide film for the first bank 11; and a polysilicon film for the second bank 12. The second bank 12 is formed by etchant containing hydrofluoric acid, $S_2F_2$ gas, or the like. As another example of combination of materials for each portion is as follows: a silicon nitride oxide film for the insulating film 18; an ITO for the first electrode 13; a silicon nitride film for the first bank 11; and a silicon oxide film (organic silane, for example, a silicon oxide film using tetraethoxysilane) for the second bank 12. The second bank 12 is formed by anisotropic etching using RIE (Reactive Ion Etching). In case that wet-etching is carried out on the second bank 12 as a silicon oxide film, mixed solution comprising ammonium hydrogen fluoride of 7.13% and ammonium fluoride of 15.4% (LAL500: Stella Chemifa Corporation) may be used as an etchant. Etching may be carried out on the silicon oxide film to form an upper edge portion of the second bank to have a curved surface by changing $CHF_3$ gas to $CF_4$ gas.

In case of forming the second bank from a silicon nitride film, $CH_3F$ gas having high selectivity for a silicon oxide film or a silicon film, which gives the second bank a different etching rate from that of the silicon oxide film or the silicon film, may be used.

Then, the organic compound layer 14 is formed by vapor deposition, and the second electrode 15 that serves as a cathode is formed thereon. Though the organic compound layer 14 is illustrated as a single layer in FIG. 11A, the organic compound layer 14 has a lamination structure comprising a hole injection layer (or a hole transporting layer), a light-emitting layer, and an electron injecting layer (or an electron transporting layer), and the like. Further, to improve a reliability of a light-emitting apparatus, it is preferable that vacuum heating (from 100° C. to 250° C.) be carried out for deaeration just before forming the organic compound layer 14. For example, vapor deposition is carried out in a deposition chamber that is evacuated to degree of vacuum of not more than $5 \times 10^{-3}$ Torr (0.665 Pa), preferably, from $10^{-4}$ to $10^{-6}$ Torr. During vapor deposition, the organic compound is vaporized by resistance heating, and is scattered in the direction of the substrate by opening a shutter. Vaporized organic compounds are scattered upward and deposited over the substrate passing through an open area provided on a metal mask. The structure shown in FIG. 2D can be obtained according to the above-mentioned process. The resistance heating that does no damage to the TFT 16 is preferable for the film-forming method for the organic compound layer 14 and the second electrode 15. Ink-jetting or spin-coating may be also utilized.

Figure 1B:
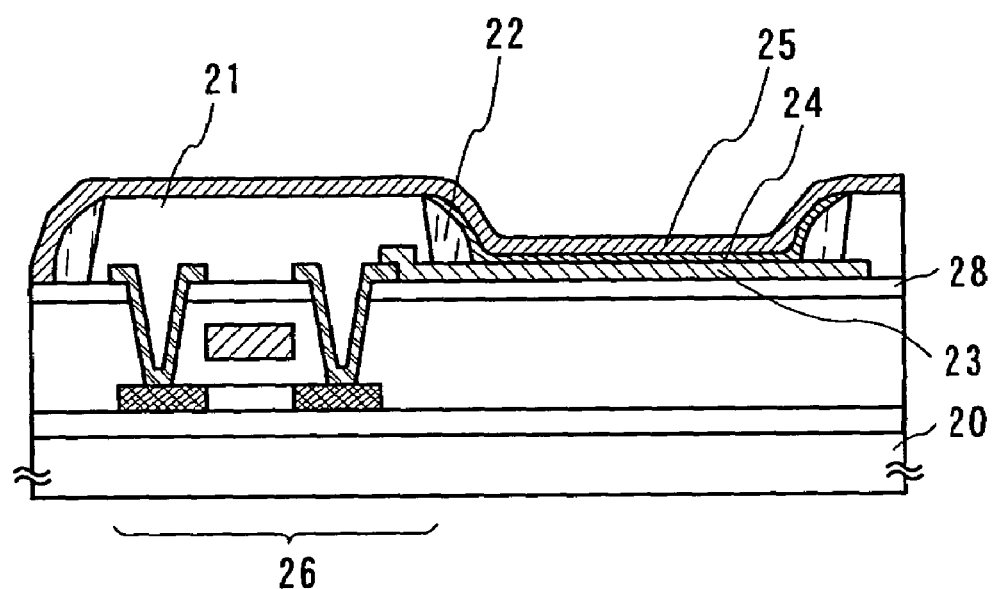

In case of forming an organic compound layer by ink-jetting or spin-coating using aqueous solution, as shown in FIG. 1B, the organic compound layer can be selectively formed by using a hydrophobic material for a first bank 21 (and a insulating film 28) and using a hydrophilic material for a second bank 22, respectively. In this case, the organic compound layer can be formed only on the second bank and an exposed surface of a first electrode 23. When a second bank is formed of hydrophobic materials, the organic compound film formed over the first electrode becomes thin at the periphery and thick at the center, and so the film uniformity can not be achieved. However, the organic compound film can be formed to have a uniform thickness over the first electrode by using hydrophilic materials for forming the second bank.

A piezo-jetting type or a bubble-jetting type which is a discharge type by thermal bubble generation, can be used as ink-jetting. The piezo-jetting has an advantage of easily controlling size of a drop by changing driving waveform of inkjet head that does not give a thermally stress on a solution used for the ink-jetting.

In FIG. 1B, reference numeral 20 is a substrate; 21 is the first bank; 22 is the second bank; 23 is the first electrode; 24 is an organic compound layer; 25 is the second electrode; 26 is a TFT; and 28 is the insulating film. Though an example of forming the organic compound layer 24 by coating is described, the organic compound layer 24 can have a lamination structure comprising a film by vapor deposition. For example, poly(ethylenedioxythiophene)/polystyrenesulphonic acid (PEDOT/PSS), camphor sulfonic acid in polyaniline (PANI/CSA), PTPDES, Et-PTPDEK, or PPBA that serves as a hole injecting layer is spin-coated, and then, baked, after that, a light-emitting layer and an electron transporting layer can be formed thereon by vapor deposition. In this case, the hole injecting layer is formed over a predetermined portion in a self-aligning manner, and a light-emitting layer, an electron transporting layer are formed by using an evaporation mask, so that each end portion thereof does not coincide with each other.

The first bank may be formed to have a hydrophobic surface by fluorination instead of using hydrophobic materials for forming the first bank.

An example of using aqueous solution is described here, but not exclusively, materials having an affinity for a solvent of materials for organic compound layer such as alcohol may be used for a first bank, and materials having no affinity for a solvent of materials for organic compound layer may be used for a second bank.

Embodiment Mode 2

Figure 3A:
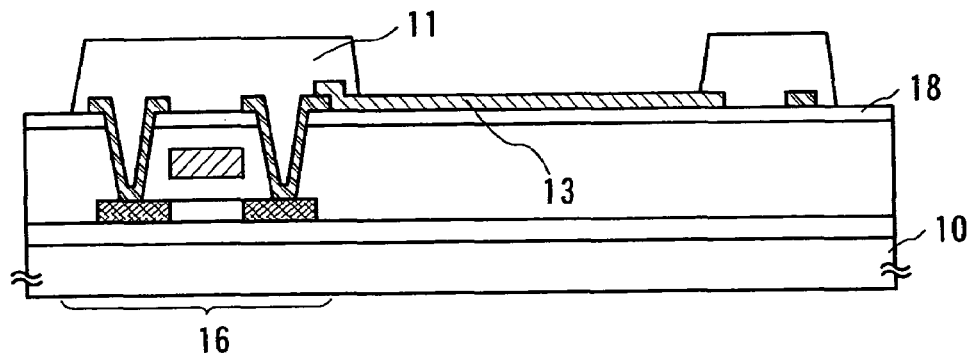
FIGS. 3A to 3D are views showing processes according to Embodiment Mode 2.
Figure 3B:
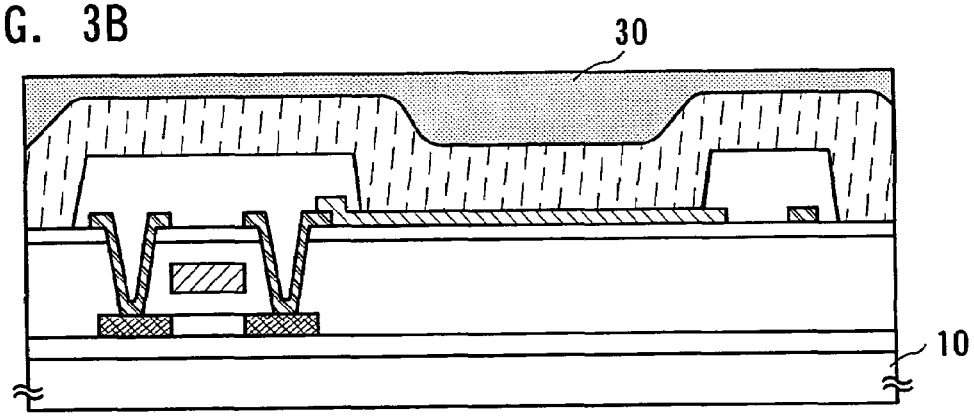
Figure 3C:
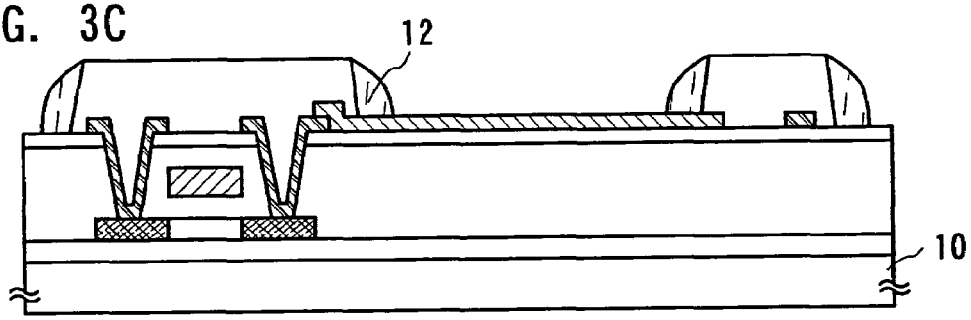

An example of preventing electrostatic discharge damage of a TFT by forming an antistatic layer during a fabrication process of an active matrix display device will be described with reference to FIGS. 3A, 3B and 3C. In FIGS. 3A, 3B and 3C, like components are denoted by like numerals as of FIG. 1A.

The TFT 16 and the first electrode 13 are formed over the substrate 10. Then, the first bank 11 to cover the edge portion of the first electrode is formed. (FIG. 3A)

An insulating film is formed over the whole surface of the substrate, and an antistatic layer 30 is formed thereon. (FIG. 3B) The electrostatic discharge damage can be prevented by forming the antistatic layer 30. Static electricity is easily charged an insulating surface. Due to this, there is a threat of adhesion of dust over the charged-surface or generating electrostatic discharge when touching another objects.

For forming the antistatic layer 30, poly(ethylenedioxythiophene)/polystyrenesulphonic acid (PEDOT/PSS), camphor sulfonic acid in polyaniline (PANI/CSA), PTPDES, Et-PTPDEK, or PPBA is spin-coated, and then, baked. The antistatic layer 30 will be removed in the following step. For the antistatic layer 30, a layer that is formed by dispersing particles of a metal such as silver, nickel, copper, tin, or an oxide thereof into an acrylic resin, polyester resin, tetraethoxysilane, or the like, for example, a layer of acrylic including conductive particles of antimonious tin oxide having not more than 0.2 μm in particle diameter in the range of from 50 to 70 weight %.

Next, the second bank 12 is formed by anisotropic etching after removing the antistatic layer 30 (FIG. 3C). For reducing the number of processes, the second bank 12 can be formed by etching the antistatic layer 30 and the insulating film by the same etching method.

In case that the antistatic layer 30 and the first electrode are formed to be in contact each other, there is a threat of changing the surface state or work function of the first electrode by reacting to materials included in the antistatic layer 30. Therefore an insulating layer is formed as a buffer layer between the antistatic layer and the first electrode, and a part of a bank that is the second bank 12 here, is formed by etching the insulating film.

Figure 3D:
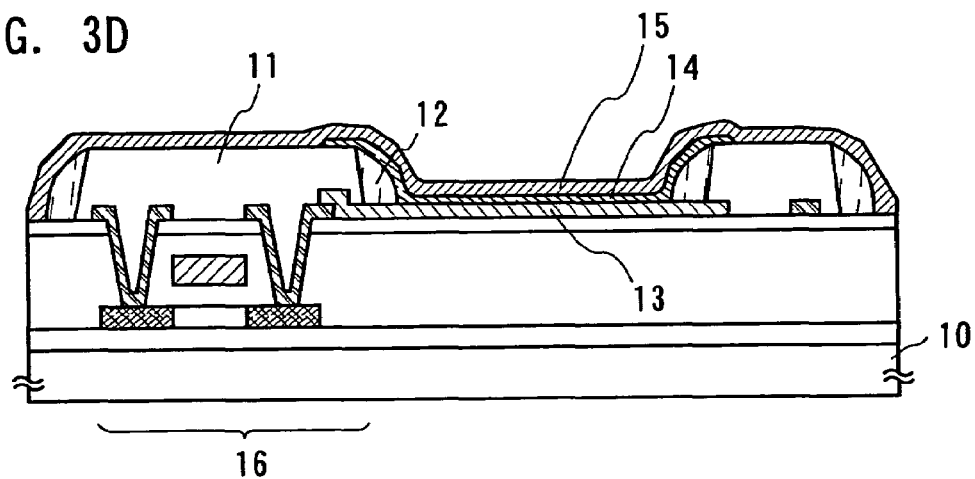

Then, the organic compound layer 14 and the second electrode 15 that serves as a cathode are formed to be laminated by vapor deposition or coating. The structure shown in FIG. 3D can be formed through the above-mentioned process.

This embodiment mode can be freely combined with Embodiment Mode 1.

Embodiment Mode 3

In Embodiment Mode 1, an example of forming the second bank that covers the side face of the first bank was described. In this embodiment mode, an example of forming a second bank that covers all over a first bank will be described with reference to FIG. 4A.

Figure 4A:
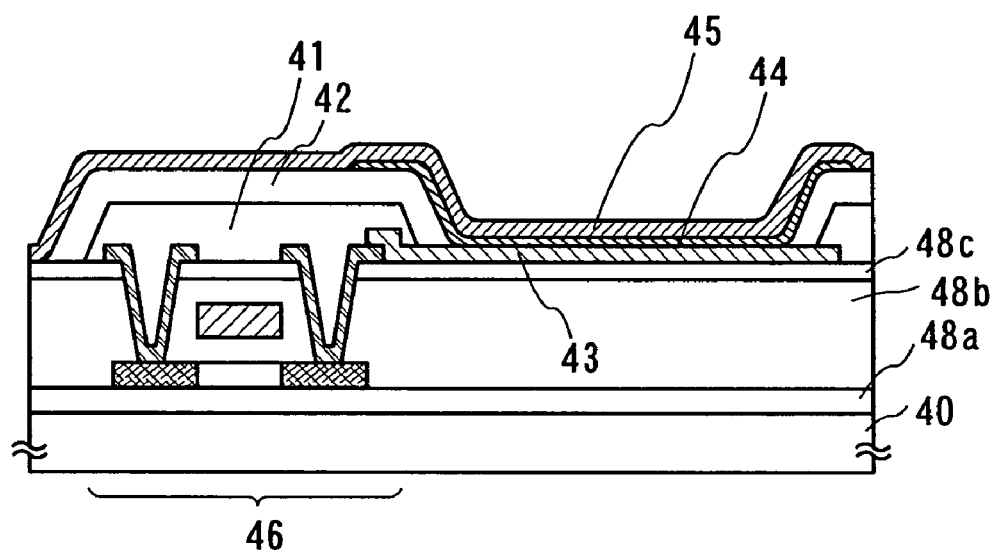
FIGS. 4A and 4B are views showing cross-sectional structures according to Embodiment Mode 3 and Embodiment Mode 4.

In FIG. 4A, reference numeral 40 is a substrate, 41 is a first bank, 42 is a second bank, 43 is a first electrode, 44 is an organic compound layer, 45 is a second electrode, 46 is a TFT, and 48a to 48c are insulating films.

An example of a fabrication process for forming the structure shown in FIG. 4A is illustrated in FIGS. 5A to 5D.

The TFT 46 is formed over the substrate 40 having an insulating surface. The TFT 46 may be formed to be an n-channel type TFT or a p-channel type TFT by a known method. Reference numeral 46a is a channel formation region, 46b, 46c are a source region or a drain region, 46d is a gate electrode, 46e, 46f are a source electrode or a drain electrode, 46g is a gate insulating film and 47 is a power source supply line. A top gate type TFT is described here, but not exclusively, a bottom gate type TFT can also be used.

The first electrode 43 that serves as an anode is formed to be partly overlapped with the electrode 46f of the TFT.

An insulating film is formed by PCVD, sputtering, or coating over the whole surface, and the first bank 41 is formed by patterning using photolithography technique. The first bank 41 covers an edge portion of the first electrode 43, the power source supply line 47, and electrodes 46e, 46f and insulates between electrodes. An example of forming the first bank 41 from inorganic insulating film (a silicon oxide film, a silicon nitride oxide film) by coating is described in this embodiment mode.

Figure 5A:
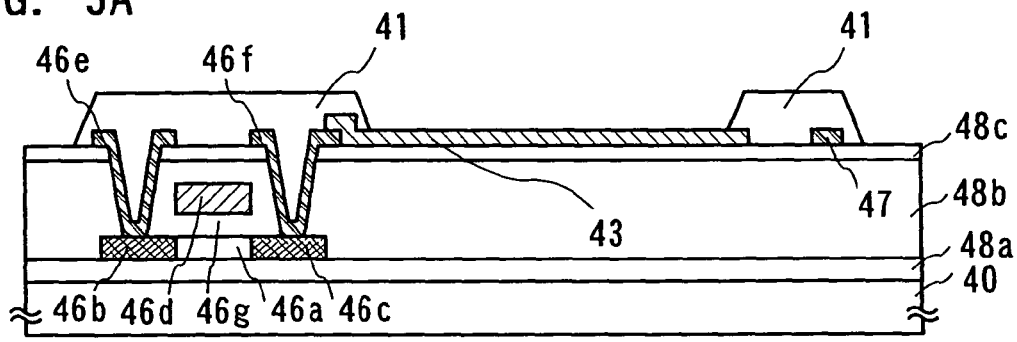
FIGS. 5A to 5D are views showing processes according to Embodiment Mode 3.
Figure 5B:
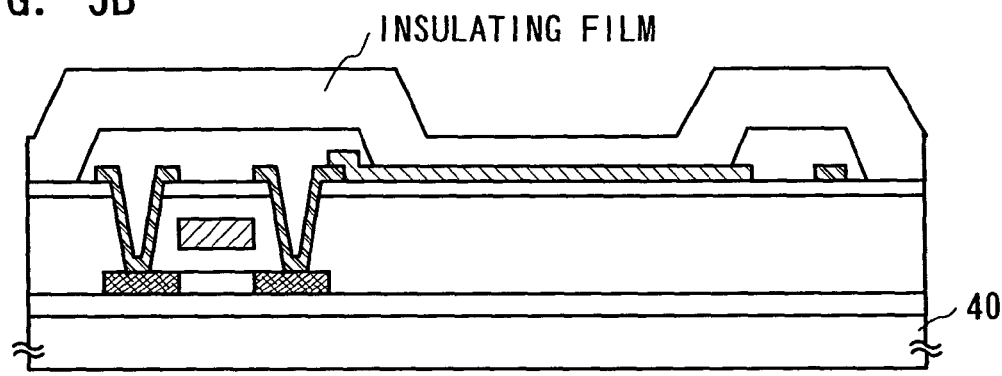
Figure 5C:
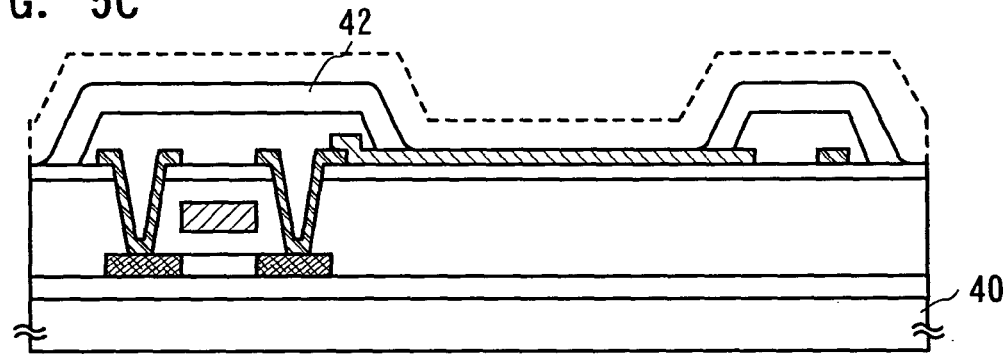
Figure 5D:
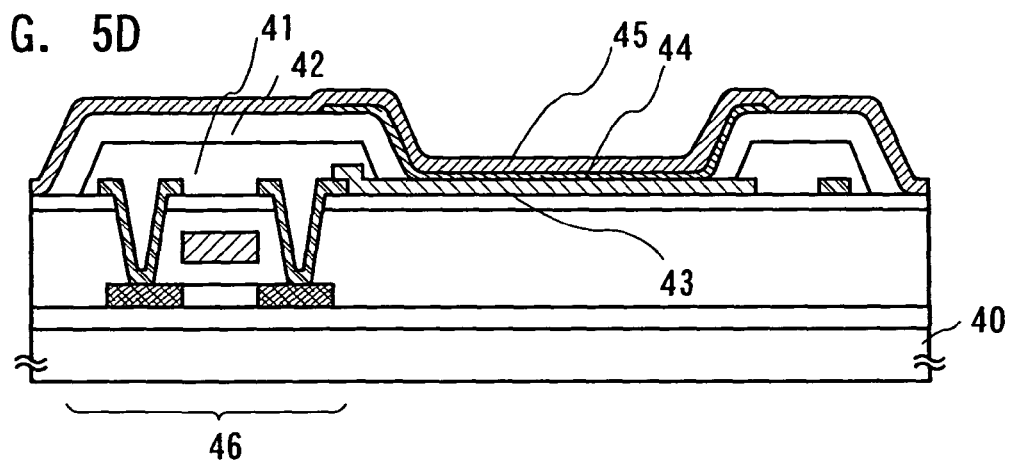

The exposed surface of the first electrode 43 is polished or washed. FIG. 5A is a cross-sectional view of one pixel at this step.

An insulating film is formed over the whole surface of the substrate. (FIG. 5B) For forming the insulating film, a material that has a same etching rate as a material for the first bank is used. As for an insulating film, a material that has different in etching rate from a material for the first bank may be used.

The second bank 42 that covers the first bank 41 is formed by etch back or anisotropic etching. Simultaneously, the first electrode surface is exposed. (FIG. 5C) The second bank 42 is formed by reflecting the irregularities of the insulating film surface by carrying out etch back. In addition, an upper edge portion of the second bank 42 can be formed into more smooth than that of the first bank 41.

Then, the organic compound layer 44 is formed by vapor deposition, and the second electrode 15 that serves as a cathode is formed thereon. The structure shown in FIG. 5D can be formed through the above-mentioned process. The resistance heating that does no damage to the TFT 46 is preferable for the film-forming method for the organic compound layer 44 and the second electrode 45. Ink-jetting or spin-coating may be also utilized.

This embodiment mode can be freely combined with Embodiment Mode 1 or Embodiment Mode 2.

Embodiment Mode 4

In Embodiment Mode 1, an example of forming the second bank that covers the side face of the first bank was described, but in this embodiment, an example of forming a first bank that covers only an electrode will be described with reference to FIG. 4B. A submicron size bank can be formed according to this embodiment mode.

Figure 4B:
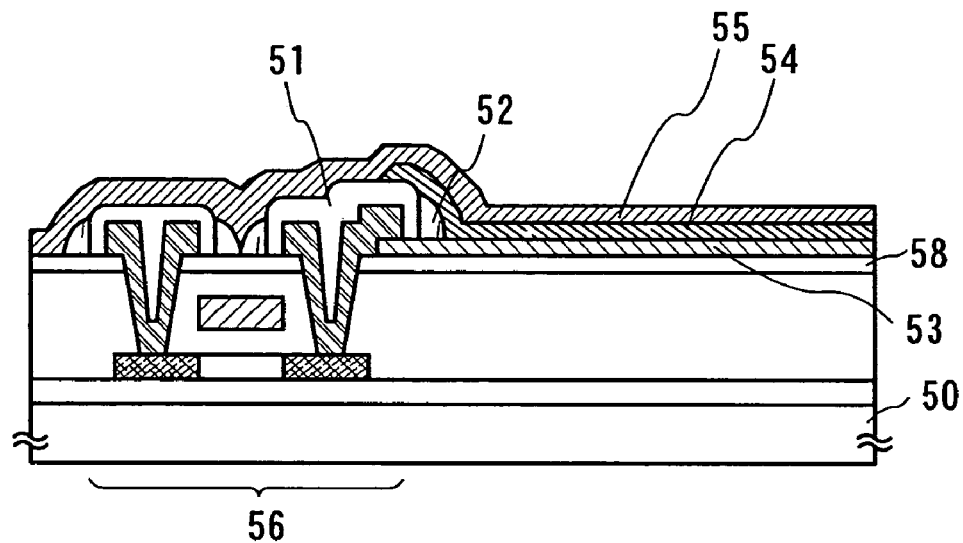

In FIG. 4B, reference numeral 50 is a substrate, 51 is a first bank, 52 is a second bank, 53 is a first electrode, 54 is an organic compound layer, 55 is a second electrode, 56 is a TFT, and 58 is an insulating film.

Here, the first bank 51 is formed of an oxide (alumina) that is obtained by carrying out oxidation treatment such as thermal oxidation or anodic oxidation on a metal electrode (an electrode containing aluminum as its main component). Therefore the number of masks can be reduced since the first bank can be formed in a self-aligning manner. An upper surface of the first bank obtained by oxidation can be formed to have an even smaller size. As a result, higher resolution can be achieved. The bank size can be extremely small, so that an aperture ratio is improved.

An electrode of the TFT (a source electrode or a drain electrode) is formed after the first electrode 53 is formed over the insulating film 58. Thereafter, an oxide film is formed by oxidation of the electrode of the TFT. The first bank 51 serves as the oxide film of the electrode so as to be not more than 0.1 μm in thickness.

An exposed surface of the first electrode 53 is polished or washed. Next, an insulating film is formed over the whole surface of the substrate. For forming the insulating film, a material that is different in etching rate from a material of the first bank is used. Since the first bank has insulated already between the electrodes, a semiconductor film (polysilicon or amorphous silicon) can be formed instead of the insulating film. The insulating film will serve as the second bank that covers a side face of the first bank in the following process.

The insulating film is almost removed by anisotropic etching or etch back, and the second bank 52 that is contact with only the side face of the first bank, and simultaneously, a first electrode surface is exposed. It is preferable that the second bank be formed to be a curved surface in a self-aligning manner by wet etching. As a result, a sidewall type bank is formed. Although insulating between pixels is possible using only the first bank, the thickness of an upper edge portion and a bottom edge portion of the first bank is easily inhomogeneous, that is, an inverted taper shape in case of forming the first bank from a metal oxide, consequently, poor coverage is easily generated. In this embodiment mode, poor coverage of the organic compound layer having thin film thickness can be prevented by covering the side face of the first bank by the second bank, and thus a reliability of a light-emitting apparatus can be improved.

As shown in Embodiment Mode 4, the second bank that covers all over the first bank 51 can be formed.

The organic compound layer 54 is formed by vapor deposition, and the second electrode 55 that serves as a cathode is formed thereon. The structure shown in FIG. 4B can be obtained through the above-mentioned process. The resistance heating that does no damage to the TFT 56 is preferable for the film-forming method for the organic compound layer 54 and the second electrode 55. Ink-jetting or spin-coating may be also useful utilized.

This embodiment mode can be freely combined with Embodiment Mode 1, Embodiment Mode 2, or Embodiment Mode 3.

Embodiment Mode 5

Therefore in case of fabricating a TFT and an EL device over a substrate, the possible solution to a problem of contamination is to separate an installation site of equipment for fabricating a TFT and an installation site of equipment for fabricating an EL device. For example, separating buildings wherein the equipment is installed, or separating the factory itself can be considered.

In case of separating the equipment, the problem will arise that substrates should be transported between the installation sites, and there is a risk of electrostatic discharge damage on the substrates and adhesion of dust to the substrates during transportation of the substrates. A TFT is extremely weak to electrostatic. A characteristic of a TFT is changed by electrostatic discharge damage or electrostatic.

Figure 6A:
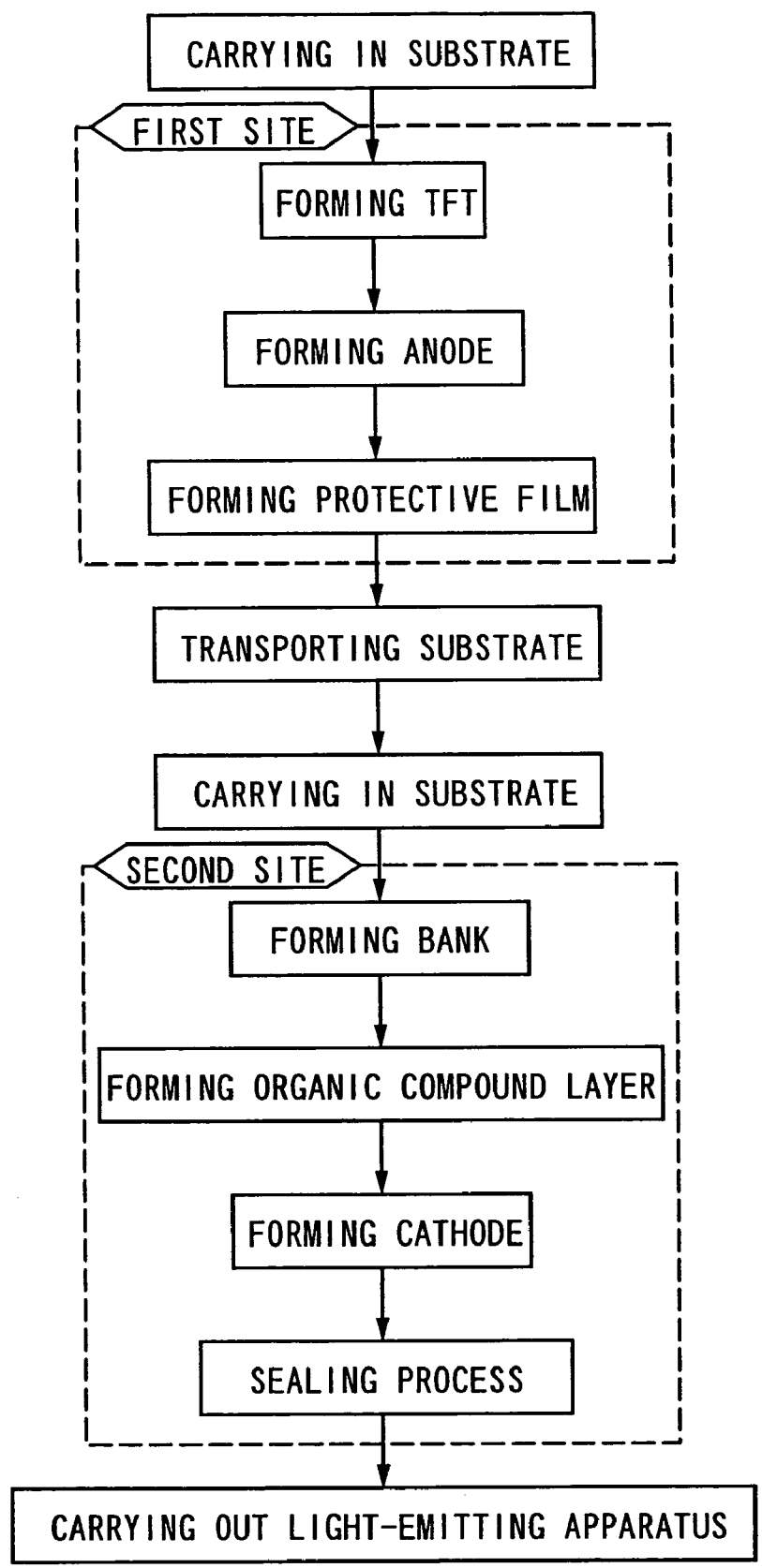
FIGS. 6A and 6B are flow charts according to Embodiment Mode 5.
Figure 6B:
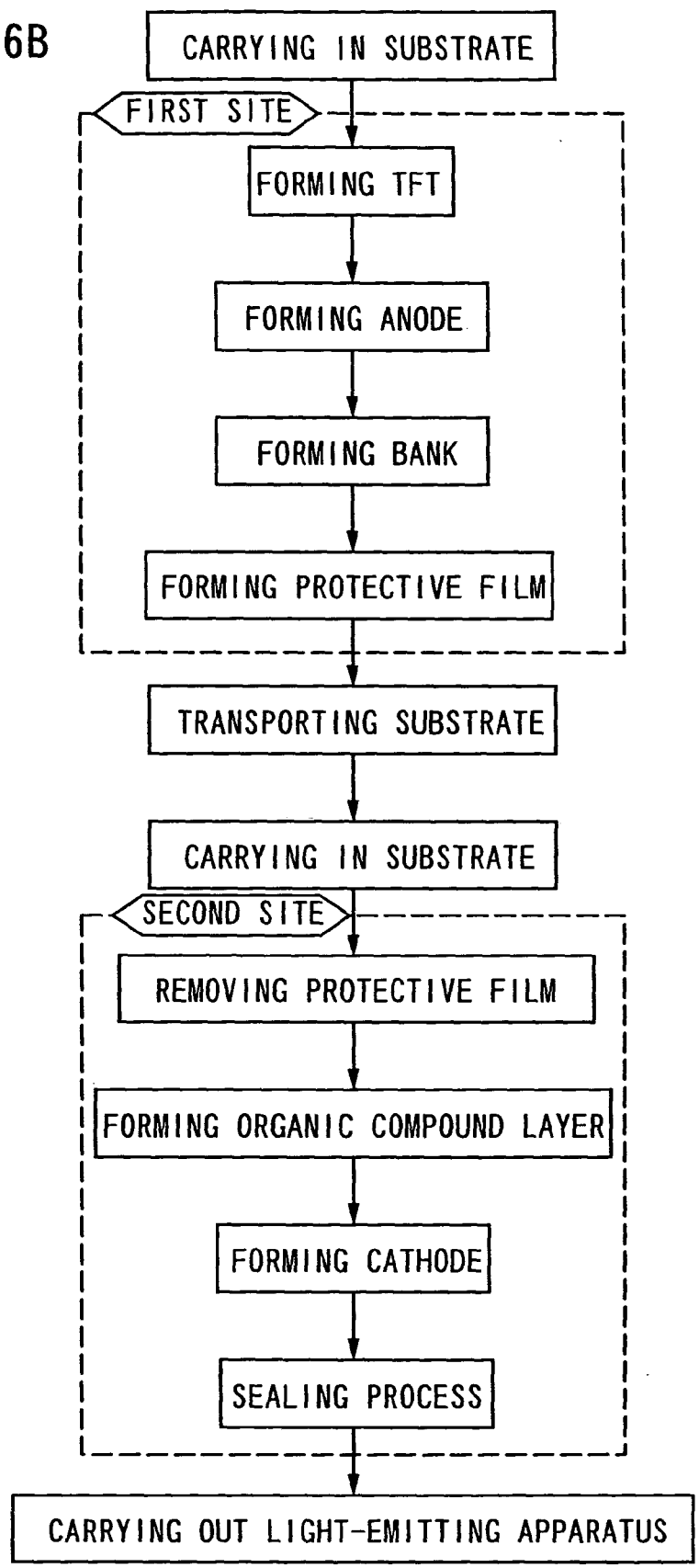

An example of a fabrication system for a light-emitting apparatus which is appropriate to the case of separating the installation site (the first site) of the fabrication equipment for a TFT and the installation site (the second site) of the fabrication equipment for an EL device is illustrated in FIGS. 6A and 6B.

FIG. 6A is an example of the flows according to the present invention.

A substrate is transported into the first site, and a TFT is formed over the substrate. And an anode for a light-emitting device is formed. Then, a protective film for protecting an anode surface is formed. The protective film is formed using a single layer formed of an insulating material or an antistatic material, or a lamination layer thereof.

Next, the substrate is transported from the first site.

Then, the substrate is transported into the second site and a bank for insulating between the anodes is formed. A part of an anode surface is exposed simultaneously with the formation of the bank. The number of processes can be reduced by forming the bank by means of etching the protective film formed in the first site.

Next, an organic compound layer is formed, and a cathode is formed, then, a light-emitting device is sealed, and then, a completed light-emitting apparatus is transported from the second installation site.

According to the system having such process flow, even if the time spent on the process from the formation of the anode to the formation of the organic compound layer is required for a long, a fabricating yield can be improved, since refuse is attached to the protective film during the transportation. It is important that the organic compound layer is formed with reducing the time spent on exposing the anode surface since the number of refuse attaching to the anode surface will be increased with time.

According to the process flow shown in FIG. 6A, it is possible that a substrate is transported before forming a bank, and vapor deposition can be carried out just after the bank is formed.

It is also possible to stock a substrate at the stage of formation of the protective film.

The first installation site can be enhanced its cleanliness and the TFT having high electric characteristics can be fabricated without an alkali metallic element that has a decisive influence on the electric characteristics of the TFT being mixed into the TFT during the process by separating the installation sites.

FIG. 6B is another example of a flow.

A substrate is transported into the first installation site and a TFT is formed over the substrate. And, an anode for a light-emitting device is formed. Then, a bank for insulating between the anodes is formed. A part of an anode surface is exposed simultaneously with forming the bank. A protective film is formed for protecting the anode surface is formed. The protective film is formed using a single layer formed of an insulating material or an antistatic material, or a lamination layer thereof.

Next, the substrate is transported from the first installation site.

Then, the substrate is transported into the second installation site and the protective film is removed. Or, a second bank as shown in Embodiment Mode 1 to Embodiment Mode 4 may be formed by carrying out anisotropic etching on the protective layer.

An organic compound layer is formed, and a cathode is formed, sequentially. Then, a completed light-emitting apparatus is transported from the second installation site.

This embodiment mode can be applied to a case that the first installation site is a first factory and the second installation site is a second factory.

According to the present invention, it is possible to prevent effectively electrostatic discharge damage and refuse attachment during the fabrication process of the light-emitting apparatus.

Embodiment Mode 6

Figure 15A:
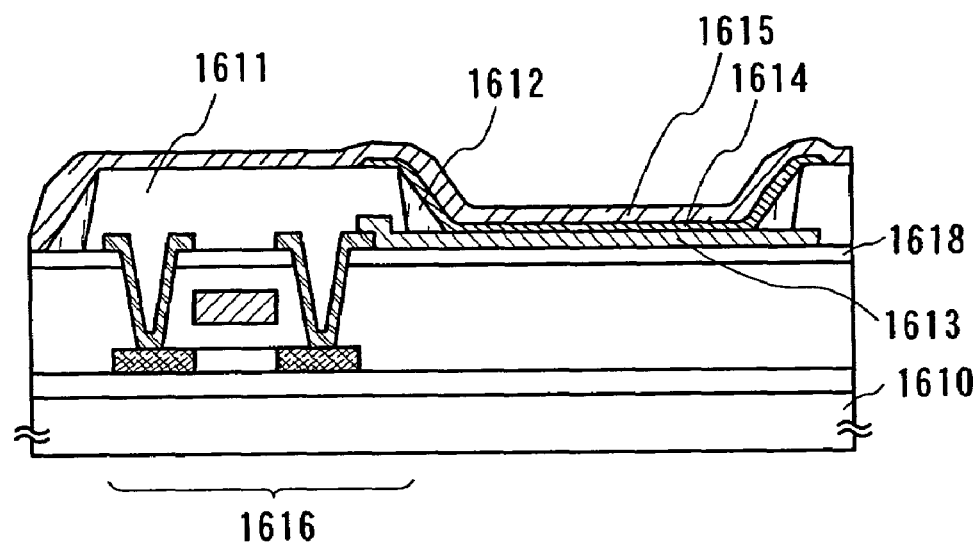
FIGS. 15A and 15B are views showing cross-sectional structures according to Embodiment Mode 6.
Figure 15B:
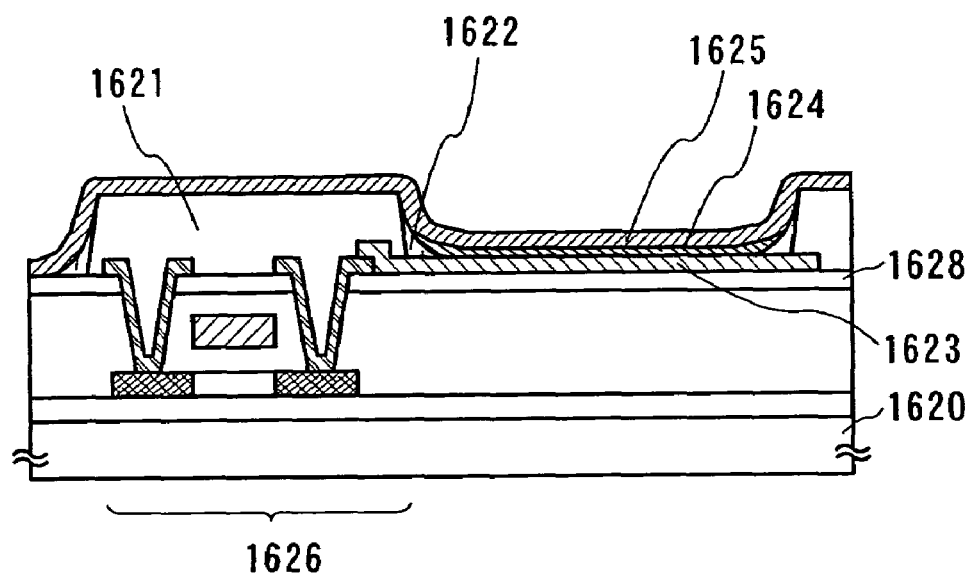

FIGS. 15A and 15B are views showing an example that the second bank has a different shape from those shown in Embodiment Mode 1 or Embodiment Mode 2.

In FIG. 15A, reference numeral 1610 is a substrate; 1611 is a first bank; 1612 is a second bank; 1613 is a first electrode; 1614 is an organic compound layer; 1615 is a second electrode; 1616 is a TFT; and 1618 is an insulating film.

As shown in FIG. 15A, the second bank 1612 has a tapered slope. The first bank 1611 is formed, and CMP or the like is carried out, and then the second bank 1612 is formed. The second bank 1612 can be formed by controlling appropriately the etching condition. The taper angle of the second bank 1612 is made smaller than that of the first bank 1611. A material for the first bank 1611 and the second bank 1612 can be appropriately selected, and it is not limited if they are insulating materials. The vicinity of a bottom edge portion of the first bank is covered, so that a region of the first electrode 1613 that is not completely polished can be covered.

In FIG. 15B, reference numeral 1620 is a substrate; 1621 is a first bank; 1622 is a second bank; 1623 is a first electrode; 1624 is an organic compound layer; 1625 is a second electrode; 1626 is a TFT; and 1628 is an insulating film.

As shown in FIG. 15B, the second bank 1622 has a curved slope which is different from the curved surface shown in FIGS. 1A and 1B (the center of the curvature radius in the curved surface is at the anode side). The second bank 1622 can be formed by controlling appropriately the etching condition. In FIG. 15B, a center of a curvature radius in the curved surface is at the cathode side. In a whole area of the light-emitting region, a film thickness of the organic compound layer can be uniform. In another structure, a film thickness of the organic compound layer tends to be thicker in the vicinity of an edge portion of the bank than that in the center portion since the organic compound layer is affected by the edge portion of the bank.

As shown in 15B, it is preferable that the second bank 1622 be formed of a material having an affinity for a material for the organic compound layer, and the first bank 1621 be formed of a material having a no affinity for a material for the organic compound layer. Consequently, in case of forming the organic compound layer by discharging a solution containing a light-emitting material from an inkjet head with giving the supersonic vibration, the solution on the first bank (having the no affinity) dividing each pixel can be moved to the second bank (having the affinity) and the first electrode surface by increasing a dynamic contact angle of the solution.

In the case of using inorganic materials for forming a first bank and organic materials for forming a second bank, the total amount of degasification from the second bank can be reduced since a shape and volume of the second bank is smaller than that shown in FIG. 1A and FIG. 15A. In the process, a time spent on vacuum baking for degasification that is carried out before vapor deposition of an organic compound layer can be reduced. The long reliability of the light-emitting apparatus is improved even after sealing the light-emitting device since an amount of degasification is small.

This embodiment mode can be freely combined with Embodiment Mode 1, Embodiment Mode 2, Embodiment Mode 3, Embodiment Mode 4, or Embodiment Mode 5.

Embodiment Mode 7

Figure 16A:
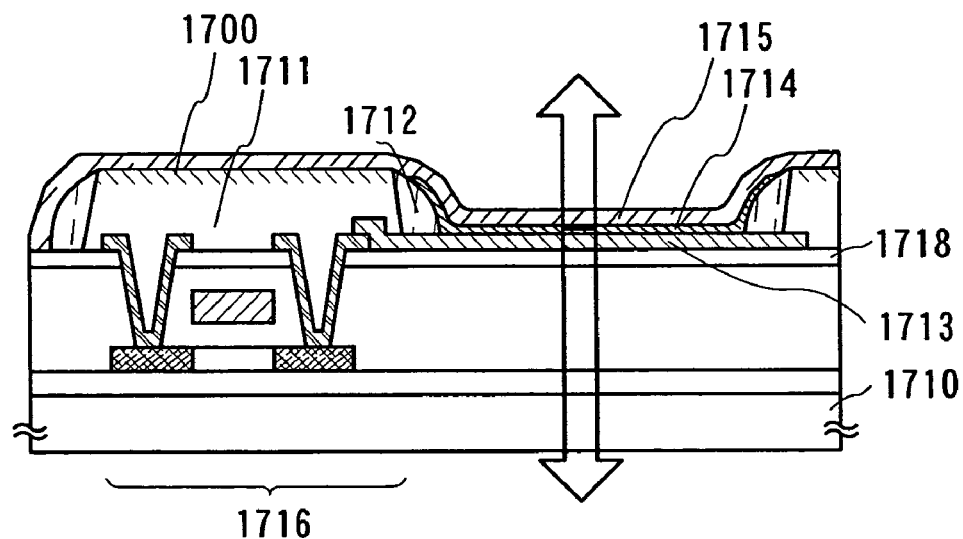
FIGS. 16A and 16B are views showing a cross-sectional structure according to Embodiment Mode 7.

FIG. 16A is a view showing an example of carrying out hydrophobic treatment on a surface of a first bank 1711.

In FIG. 16A, reference numeral 1710 is a substrate; 1711 is a first bank; 1712 is a second bank; 1713 is a first electrode; 1714 is an organic compound layer; 1715 is a second electrode; 1716 is a TFT; and 1718 is an insulating film.

The first electrode 1713 formed of a transparent conductive film (an ITO or the like) is formed by patterning, and a silicon oxide film is formed over the whole substrate. Then, a surface 1700 is obtained by carrying out hydrophobic treatment using $SiH_mF_n$ gas plasma treatment. And then, the first bank 1711 is formed by patterning.

A resin film formed of polyvinyl pyrrolidone is formed, and the second bank 1712 is formed by patterning. Then, the organic compound layer 1714, and the second electrode 1715 are formed sequentially. In addition, in case of using coating or ink-jetting for forming the organic compound layer 1714, the solution on the first bank (hydrophobicity) dividing each pixel can be moved to the second bank (hydrophilicity) and the first electrode surface by increasing the dynamic contact angle of the solution.

The cathode that is comprising a lamination layer of a thin metal film (Ag or Al) and a transparent conductive film (an ITO or the like) is used as the second electrode 1715 to pass the luminance generated in the organic compound layer 1714. Therefore a light-emitting apparatus that can emit light upward from the substrate 1710 position and downward from the substrate 1710 position can be formed. The direction of the light extraction is not particularly limited, the light-emitting apparatus that can emit light in either direction can be employed.

Figure 16B:
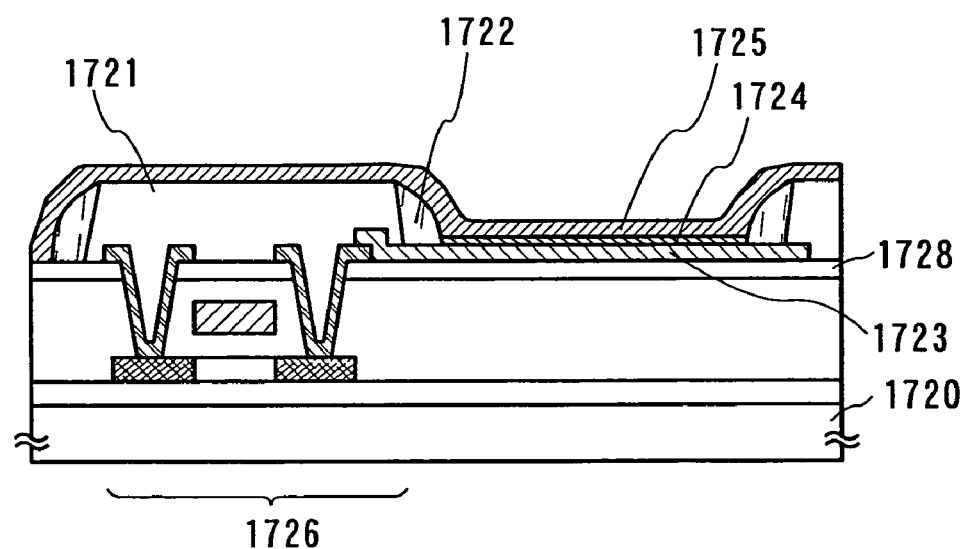

FIG. 16B is a view showing that a hydrophobic material is used for both a first bank 1721 and a second bank 1722. A silicon nitride film is formed over a first electrode 1723 by PCVD, and the first bank is formed by patterning, and then, the second bank is formed by etch back after an epoxy resin is formed by coating. In addition, in case of using coating or ink-jetting for forming an organic compound layer 1724, a solution on the first bank (hydrophobicity) dividing each pixel and the second bank (hydrophobicity) can be moved only to a first electrode surface by increasing the dynamic contact angle of the solution.

In FIG. 16B, reference numeral 1720 is a substrate; 1721 is the first bank; 1722 is the second bank; 1723 is the first electrode; 1724 is the organic compound layer; 1725 is a second electrode; 1726 is a TFT; and 1728 is an insulating film.

This embodiment mode can be freely combined with Embodiment Mode 1, Embodiment Mode 2, Embodiment Mode 3, Embodiment Mode 4, Embodiment Mode 5, or Embodiment Mode 6.

Embodiment Mode 8

In this embodiment mode, an example of forming an auxiliary electrode formed of a low resistance metallic material for reducing an electric resistance of a transparent electrode in case of employing a top emission structure will be described.

Figure 17A:
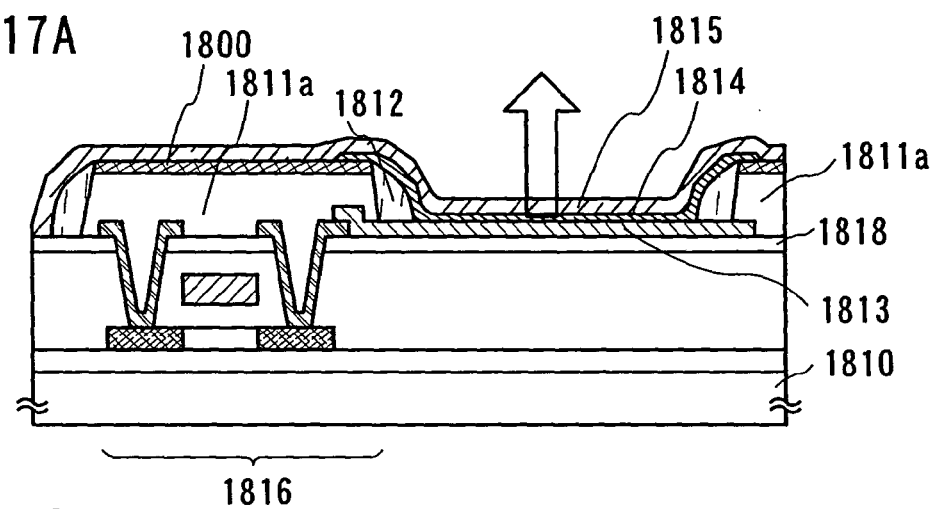
FIGS. 17A and 17B are views showing cross-sectional structures.

In FIG. 17A, reference numeral 1800 is an auxiliary electrode; 1810 is a substrate; 1811a is a first bank; 1812 is a second bank; 1813 is a first electrode; 1814 is an organic compound layer; 1815 is a second electrode; 1816 is a TFT; and 1818 is an insulating film.

For obtaining the structure shown in FIG. 17A, the TFT 1816 is formed over the substrate 1810 and the first electrode 1813 is formed.

The first electrode 1813 is formed of a metallic material having large work function, specifically, platinum (Pt), chromium (Cr), tungsten (W), or nickel (Ni). The first electrode 1813 may be formed using a transparent conductive film (ITO). In this case, a light-emitting apparatus that can emit light upward from the substrate 1810 position and downward from the substrate 1810 position can be formed.

Next, an insulating film is formed over the whole substrate, and a metal film formed of a low resistance metallic material (poly-Si doped with impurity elements that imparts a conductivity type, an element selected from W, $WSi_x$, Al, Ti, Mo, Cu, Ag, Ta, Cr, or Mo, a film containing an alloy material containing the above elements as its main component or a compound material, or a lamination layer comprising these films) is formed continuously by sputtering. Then, etching is carried out selectively using a mask on a metal film and an insulating film to form the auxiliary electrode 1800 and the first bank 1811. Etching can be carried out using the same mask, in this case, the patterning shapes of the auxiliary electrode 1800 and the first bank 1811 is uniform. In the case of carrying out etching using the same mask, it is possible that the auxiliary electrode can be formed without increasing the number of masks.

The first electrode surface 1813 is polished, and an insulating film is formed by coating, and then, the second bank 1812 is formed by carrying out etch back.

The organic compound layer 1814 is formed by vapor deposition, ink-jetting, or coating. Then, the second electrode 1815 comprising a lamination layer of a thin metal film (a thickness of not more than 10 μm) and a transparent conductive film is formed by sputtering.

The second electrode 1815 is composed of a lamination film of a thin metal film formed of an alloy of MgAg, MgIn, AlLi, or the like, a transparent conductive film (Indium-tin-oxide (ITO), a transparent conductive film ($In_2O_3$—ZnO), zinc oxide (ZnO), or the like). The second electrode 1815 serves as a cathode of the light-emitting device, and pass the light from each light-emitting device.

The structure shown in FIG. 17A can be obtained through the above-mentioned process.

Since the resistance value of the transparent conductive film is comparatively high, it is difficult to form into a large-size screen. However, providing the auxiliary electrode 1800 is resulted in reducing the resistance of a cathode as a whole. Consequently, a large-size screen can be formed, in addition, the transparent conductive film can be formed to be thin.

Figure 17B:
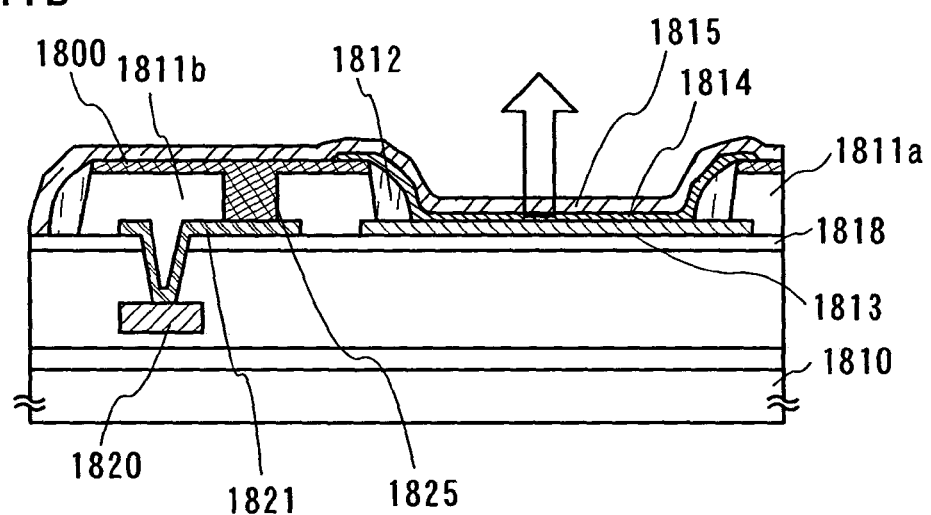

A contact hole with wirings at a bottom can be formed by increasing one more mask. FIG. 17B is a view showing an example of a connection of a cathode and a leading out wiring via the auxiliary electrode.

The first electrode is formed by the same fabrication process of FIG. 17A, and an insulating film is formed over the whole surface.

Next, etching is carried out for forming a contact hole that reaches to an electrode 1812 at the bottom shown in FIG. 17B. Then, a metal film is formed.

First banks 1811b, 1811a, and the auxiliary electrode 1800 are formed by etching the metal film and the insulating film using the same mask by the same fabrication process shown in FIG. 17A.

The organic compound layer 1814 and the electrode 1815 composed of a lamination layer of a thin metallic film (a thickness of not more than 10 μm) and a transparent conductive film by the same fabrication process shown in FIG. 17A.

The structure shown in FIG. 17B can be obtained through the above-mentioned process. The auxiliary electrode 1800 has the same potential as that of the second electrode 1815 and an electrode 1821. The electrode 1821 is electrically connected to an electrode 1820. Though not shown, the electrode 1820 is a lead wiring (a connection wiring) and extended to a terminal portion.

On the contrary to FIG. 8A wherein a connection region for the conduction of the cathode and the connection wiring is provided between a source side drive circuit and a pixel portion, the connection region can be omitted since it is possible to conduct the cathode and the connection wiring by the auxiliary electrode 1800 in a pixel portion.

Figure 17C:
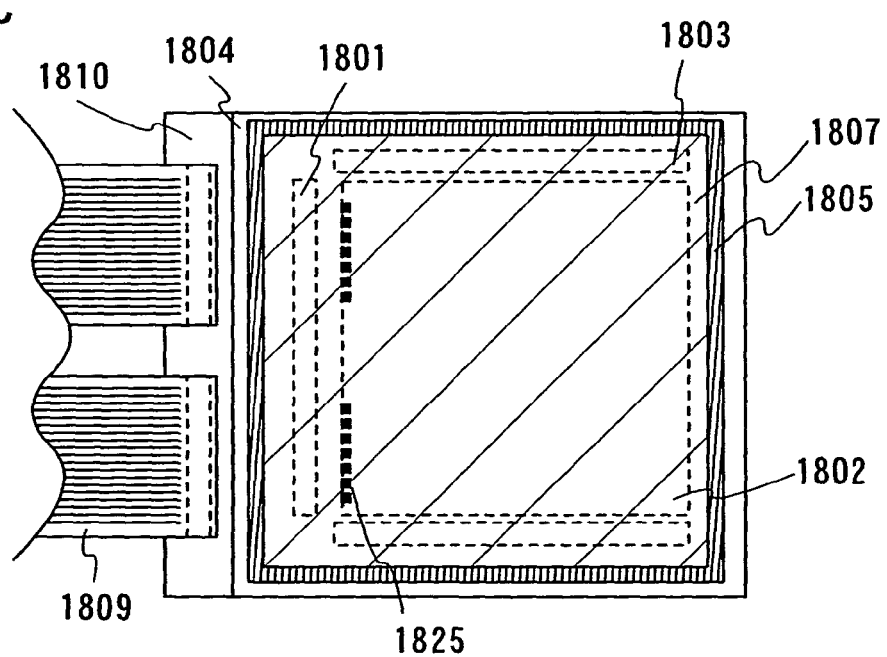
FIG. 17C is a top view according to Embodiment Mode 8.

Although it is possible that the cathode and the wirings at the bottom can be connected in each pixel, it is preferable that the several auxiliary electrodes that makes the cathode and the connection wiring conduct each other be provided at the bank in a periphery potion of a display portion in case that an aperture ratio is prioritized. FIG. 17C is a view showing an example of a top view of a panel.

As shown in FIG. 17C, conduction of the cathode and the connection wiring are formed in the periphery portion of a pixel portion 1802. In FIG. 17C, a contact portion 1825 that has fourteen contact holes is formed. In the contact portion 1825 having the structure shown in FIG. 17B, the first bank 1811b is formed. In the pixel portion 1802 having the structure shown in FIG. 17A, the first bank 1811a is formed. In FIG. 17C, an area covered with wirings and circuits other than the pixel portion can be reduced.

In FIG. 17C, reference numeral 1801 indicated by the dotted line is a source signal line drive circuit; 1802 is the pixel portion; 1803 is a gate signal line drive circuit; 1810 is a substrate; 1804 is a transparent sealing substrate; 1805 is a first sealant; and 1807 is a second transparent sealant which fills the inside closed by the first sealant 1805. The first sealant 1805 contains gap agents for keeping substrate intervals.

The connection wiring (not shown) for transmitting a signal that is inputted to the source signal line drive circuit 1801 and the gate signal line drive circuit 1803 accepts video signals or clock signals from FPC (flexible printed circuit) that serves as an external input terminal. Although only FPC is illustrated, a printed wiring board (PWB) can be attached to the FPC.

This embodiment mode can be freely combined with Embodiment Mode 1, Embodiment Mode 2, Embodiment Mode 3, Embodiment Mode 4, Embodiment Mode 5, Embodiment Mode 6, or Embodiment Mode 7.

Embodiment Mode 9

Figure 18:
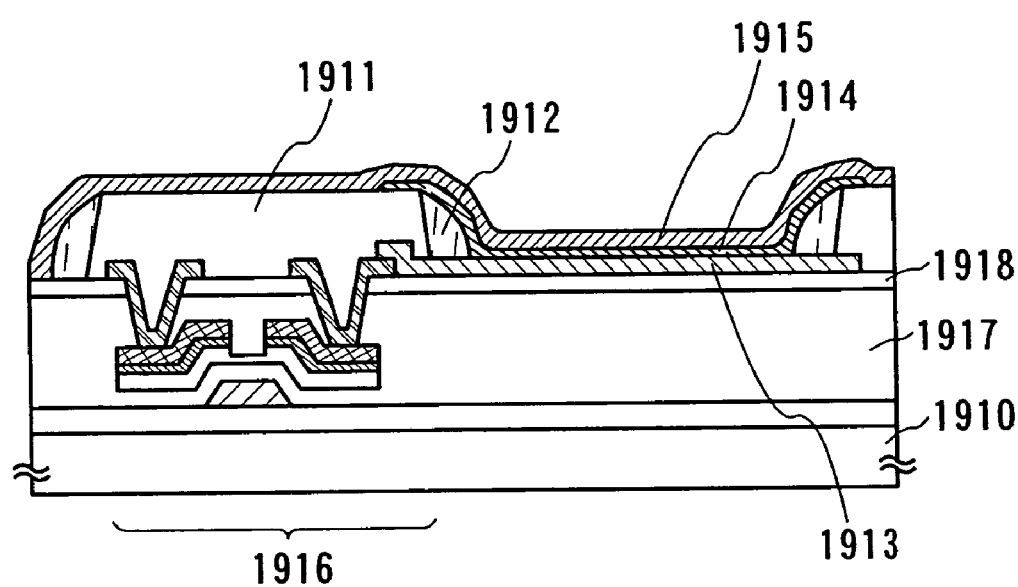
FIG. 18 is a view of a cross-sectional structure according to Embodiment Mode 9.

FIG. 18 is a view showing an example of a TFT that uses amorphous silicon as an active layer instead of a TFT that uses polysilicon as an active layer.

In FIG. 18, reference numeral 1910 is a substrate; 1911 is a first bank; 1912 is a second bank; 1913 is a first electrode; 1914 is an organic compound layer; 1915 is a second electrode; 1916 is an amorphous silicon TFT; and 1917, 1918 are insulating films.

Known technique can be used as the fabrication steps of the amorphous silicon TFT 1916. First, a base insulating film is formed over the substrate 1910, and patterning is carried out on a gate electrode, and then, a gate insulating film is formed. Second, an amorphous silicon film (active layer), an amorphous silicon film containing phosphorous (n+ layer), and a metal film are stacked sequentially. Third, patterning is carried out on the amorphous silicon film to be a desired device shape, and etching is carried out selectively on the region that overlaps with the gate electrode to expose a part of the amorphous silicon, and then, a channel is formed. Then, the whole surface is covered with the insulating films 1917, 1918, and a contact hole, a source wiring, and a drain wiring are formed.

The amorphous silicon TFT 1916 is formed to be a channel etching type TFT, but also formed to be a channel stop type TFT.

The process after the fabrication of the amorphous silicon TFT is the same as in Embodiment Mode 1, wherein the first electrode 1913 is formed, and the first bank 1911 is formed, then, the first electrode surface 1913 is polished, and then, the second bank 1912 is formed by carrying out etch back after the insulating film is formed by coating.

The organic compound layer 1914 is formed by vapor deposition, ink-jetting, of coating. Next, the second electrode 1915 is formed by vapor deposition or sputtering.

Since the process for an amorphous silicon TFT is required few high temperature treatment, the process is suitable for mass production. Thus, the costs of fabricating a light-emitting apparatus can be reduced.

Since an example of using an amorphous silicon TFT is described in this embodiment mode, a pixel portion and a drive circuit are not formed over the same substrate, but only a pixel portion is formed over the substrate, and a drive circuit has an IC structure.

This embodiment mode can be freely combined with Embodiment Mode 1, Embodiment Mode 2, Embodiment Mode 3, Embodiment Mode 4, Embodiment Mode 5, Embodiment Mode 6, Embodiment Mode 7, or Embodiment Mode 8.

Embodiments of the present invention having above-described composition are described in more detail below.

Embodiment 1

FIGS. 8A and 8B show an example of fabricating a light-emitting apparatus (having a top emitting structure) that includes a light-emitting device having an organic compound layer as a light-emitting layer over a substrate having an insulating surface.

FIG. 8A is a top view showing the light-emitting apparatus, and FIG. 8B is a cross-sectional view taken along the line A-A' of FIG. 8A. Reference numeral 1101 indicated by the dotted line is a source signal line drive circuit; 1102 is a pixel portion; and 1103 is a gate signal line drive circuit. Further, reference numeral 1104 is a transparent sealing substrate; 1105 is a first sealant; and 1107 is a transparent second sealant. An inside area surrounded by the first sealant 1105 is filled with the transparent second sealant 1107. The first sealant 1105 contains a gap material for spacing out the sealing substrate 1104 and the substrate 1110.

Reference numeral 1108 is a connection wiring for transmitting a signal to be inputted to the source signal line drive circuit 1101 and the gate signal line drive circuit 1103. The connection wiring 1108 receives a video signal or a clock signal from a flexible printed circuit (FPC) 1109 which becomes an external input terminal. Although only the FPC 1109 is illustrated here, a printed wiring board (PWB) may be attached to the FPC 1109.

Subsequently, a cross-sectional structure will be described with reference to FIG. 8B. A drive circuit and a pixel portion are formed over the substrate 1110. Here, the source signal line drive circuit 1101 as the drive circuit and the pixel portion 1102 are illustrated.

The source signal line drive circuit 1101 is formed of a CMOS circuit that is a combination of an n-channel type TFT 1123 and a p-channel type TFT 1124. The TFT that constitutes the drive circuit can be formed by a known circuit such as a CMOS circuit, a PMOS circuit, or an NMOS circuit. A drive circuit formed over a substrate that is referred to a driver integrated type is described in this embodiment, but not exclusively, the drive circuit may be formed outside of a substrate. The structure of TFT using a polysilicon film as an active layer is not particularly limited, it may be either a top gate type TFT or a bottom gate type TFT.

The pixel portion 1102 is formed with a plurality of pixels each of which includes a switching TFT 1111, a current controlling TFT 1112, and a first electrode (anode) 1113 which is electrically connected to a drain of the current-controlling TFT 1112. The current controlling TFT 1112 may be either an n-channel type TFT or a p-channel type TFT, but when it is connected to an anode, it is preferable to be a p-channel type TFT. It is also preferable that a storage capacitor (not shown) be appropriately provided. Here, though the cross-sectional structure of only one pixel out of thousands of pixels having two TFTs is exemplified, three or more TFTs can be provided appropriately with the one pixel.

Since the first electrode 1113 is directly connected to a drain of the TFT, it is preferable that a lower layer of the first electrode 1113 be formed of the material that can be an ohmic contact with the drain containing silicon and an uppermost layer of the first electrode 1113 which is in contact with an organic compound layer be formed of the material that has a large work function. For example, a three-layer structure comprising a titanium nitride film, a film containing aluminum as its main components, and a titanium nitride film, can have a low resistance as a wiring, and be a favorable ohmic contact with the drain, and also, serve as an anode. Further, the first electrode 1113 may be formed of a single layer such as a titanium nitride film, a chromium film, a tungsten film, a zinc film, a platinum film or the like, or a lamination layer of three or more layers.

Insulators 1114a, 1114b (referred to as a bank, or the like) are formed to cover an edge of the first electrode (anode) 1113. The insulators 1114a, 1114b may be formed of either an organic resin film or an insulating film containing silicon according to Embodiment Mode 3. Here, the insulator 1114a is formed of a silicon oxide film and the insulators 1114b is formed of a positive type photosensitive acrylic resin film. Thus, insulators 1114a and 1114b can be formed into the shape as shown in FIG. 8B.

To improve coverage, an upper edge portion or a bottom edge portion of the insulator 1114b is formed to have a curved surface having curvature. For example, in case that a positive type photosensitive acrylic is used as a material for the insulator 1114b, it is preferable to form only the upper edge portion of the insulator 1114b having a curved surface having radius of curvature (from 0.2 μm to 3 μm). Either a negative type that become an insoluble material in etchant according to light for photosensitive material or a positive type that become dissoluble in etchant according to light for photosensitive material can be used as an insulator 1114b.

An organic compound layer 1115 is selectively formed over the first electrode (anode) 1113 by vapor deposition using an evaporation mask or ink-jetting. Further, a second electrode (cathode) 1116 is formed over the organic compound layer 1115. As the cathode, a material having a small work function (for example, Al, Ag, Li, Ca, or alloys thereof such as MgAg, MgIn, AlLi, $CaF_2$, or CaN) may be used. In this embodiment, the second electrode (cathode) 1116 is formed of a lamination layer of a metal thin film having a thin thickness and a transparent conductive film (for example, an indium oxide-tin oxide alloy (ITO), an indium oxide-zinc oxide alloy ($In_2O_3$—ZnO), zinc oxide (ZnO), or the like) in order that the second electrode may transmit luminescence. A light-emitting device 1118 comprising the first electrode (anode) 1113, the organic compound layer 1115, and the second electrode (cathode) 1116 is thus fabricated. In this embodiment, since the example of the light-emitting device 1118 that emits white light is exemplified, a color filter (for ease of explanation, an overcoat layer is not shown here) comprising a coloring layer 1131 and a light shielding layer (Black Matrix: BM) 1132 is provided.

Further, if each organic compound layer that can achieve R, G, and B emission is formed selectively, a full color display can be obtained without using a color filter.

A transparent protective layer 1117 is formed in order to seal the light-emitting device 1118. The transparent protective lamination layer may be formed of a silicon nitride film, silicon oxide film, a silicon nitride oxide film (SiNO film: a ratio of N to O of composition is N>O), or silicon oxynitride film (SiON film: a ratio of N to O of composition is N<O), or a thin film containing carbon as its main component (for example, DLC film, or CN film) formed by sputtering or CVD. In this embodiment, the transparent protective layer 1117 is formed of a silicon nitride film formed by a silicon target under an atmosphere comprising nitrogen and argon that has high blocking effects against impurity elements such as moisture, alkali metal, or the like. It is preferable that the total thickness of the transparent protective layer be formed to be thin as far as possible in order that light may pass through the transparent protective layer.

Further, in order to seal the light-emitting device 1118, the sealing substrate 1104 is bonded to the substrate by the first sealant 1105 and the second sealant 1107 under an inert gas atmosphere. It is preferable to use an epoxy resin as a material for the first sealant 1105 and the second sealant 1107. It is also preferable that the first sealing agent and the second sealant inhibit transmission of moisture or oxygen as possible.

Further, in this embodiment, a plastic substrate formed of fiberglass-reinforced plastics (FRP), polyvinylfluoride (PVF), Mylar, polyester, an acrylic resin, or the like, in addition to a glass substrate or a quartz substrate can be used as a material which constitutes the sealing substrate 1104. It is possible that a third sealing material is applied to a side face (exposed face) of the sealing substrate and the substrate after bonding the sealing substrate 1104 using the first sealant 1105 and the second sealant 1107.

By sealing and the light-emitting device as described above, it becomes possible that the light-emitting device can be encapsulated completely and penetration of moisture or oxygen from outside that causes deterioration of the light-emitting device can be prevented. Consequently, light-emitting device having high reliability can be obtained.

Further, a both top and bottom emitting type light-emitting apparatus can be formed by using a transparent conductive film as the first electrode 1113.

In this embodiment, an example of the light-emitting apparatus structure that has the light-emitting device in which an organic compound layer is formed over an anode and a cathode that is a transparent electrode is formed over the organic compound layer (hereinafter, "top emission structure") is described. On the other hand, a light-emitting apparatus may be formed to have a structure that has a light-emitting device in which an organic compound layer is formed over an anode and a cathode is formed over the organic compound layer (hereinafter referred to as "bottom emission structure"), and luminescence generated within the organic compound layer emits in the direction of a TFT through the anode that is a transparent electrode.

An example of a light-emitting apparatus having a bottom emission structure is shown in FIGS. 9A and 9B.

FIG. 9A is a top view of the light-emitting apparatus and FIG. 9B is a cross-sectional view of FIG. 9A taken along the line A-A'. Reference numeral 1201 indicated by the dotted line is a source signal line drive circuit; 1202 is a pixel portion; and 1203 is a gate signal line drive circuit. Further, reference numeral 1204 is a sealing substrate; 1205 is a sealant containing a gap material for spacing out enclosed spaces; and an inside area surrounded by the sealant 1205 is filled with an inert gas (typically, a nitrogen gas). A trace quantity of moisture remained in the inside space surrounded by the sealant 1205 is removed by a desiccant 1207, accordingly, the space is made sufficiently dry.

Reference number 1208 is a connection wiring for transmitting a signal to be inputted to the source signal line drive circuit 1201 and the gate signal line drive circuit 1203. The connection wiring 1208 receives a video signal or a clock signal from a flexible printed circuit (FPC) 1209 which becomes an external input terminal.

Subsequently, a cross sectional structure will be described with reference to FIG. 9B. A drive circuit and a pixel portion are formed over a substrate 1210, but the source signal line drive circuit 1201 as the drive circuit and the pixel portion 1202 are shown in FIG. 9B. The source signal line drive circuit 1201 is formed of a CMOS circuit that is a combination of an n-channel type TFT 1223 and a p-channel type TFT 1224.

The pixel portion 1202 is formed with a plurality of pixels each of which includes a switching TFT 1211, a current controlling TFT 1212, and a first electrode (anode) 1213 formed of a transparent conductive film that is electrically connected to a drain of the current controlling TFT 1212.

In this embodiment, the first electrode 1213 is formed to a part thereof to be overlapped with a connecting electrode so as to be electrically connected to a drain region of the TFT 1212 via the connecting electrode. It is preferable that the first electrode 1213 be formed of a conductive film that has transparency and a large work function (for example, an indium tin oxide (ITO), an indium oxide-zinc oxide alloy ($In_2O_3$—ZnO), zinc oxide (ZnO), or the like).

Insulators 1214*a*, 1214*b* (referred to as a bank, or the like) are formed to cover an edge portion of the first electrode (anode) 1213. To improve coverage, an upper edge portion or a lower edge portion of the insulating substance 1214*b* is formed to have a curved surface having a curvature. The insulators 1214*a*, 1214*b* can be formed to be a side wall type insulator according to Embodiment Mode 1.

An organic compound layer 1215 is selectively formed over the first electrode (anode) 1213 by vapor deposition using an evaporation mask or ink-jetting. Further, a second electrode (cathode) 1216 is formed over the organic compound layer 1215. As a material for forming the cathode, a small work function material (for example Al, Ag, Li, Ca, alloys thereof, that is, MgAg, MgIn, AlLi, $CaF_2$, or CaN) may be used. Thus, a light-emitting device 1218 comprising the first electrode (anode) 1213, the organic compound layer 1215 and the second electrode (cathode) 1216 are fabricated. The light-emitting device 1218 emits light in the direction indicated by an arrow in FIG. 9B. The light-emitting device 1218 in this embodiment is a type of light-emitting devices which can achieve monochrome emission of R, G, or B. Full color emission can be achieved by a light-emitting device in which each organic compound layer that can achieve R, G, and B emission is formed selectively.

Further, a protective layer 1217 is formed in order to seal the light-emitting device 1218.

Further, in order to seal the light-emitting device 1218, the sealing substrate 1204 is bonded to the substrate by the sealant 1205 under an inert gas atmosphere. A depressed portion is formed over a surface of the sealing substrate 1204 by sandblast in advance. Then, desiccant 1207 is placed to a depressed portion over the sealing substrate 1204. It is preferable to use material including a group of an epoxy resin as the material for the sealant 1205. It is also preferable that the sealant 1205 inhibit transmission of moisture or oxygen as possible.

Further, in this embodiment, a plastic substrate formed of fiberglass-reinforced plastics (FRP), polyvinyl fluoride (PVF), Mylar, polyester, an acrylic resin or the like, in addition to a metal substrate, a glass substrate or a quartz substrate can be used as a material for the sealing substrate 1204 having the depressed portion. The light-emitting device can be sealed by using a metal can pasted a desiccant to its inside.

Further, this embodiment can freely be combined with any one of Embodiment Mode 1 to Embodiment Mode 9.

Embodiment 2

In this embodiment, an example of fabricating such a device that has various functions of materials and a division of function within a lamination structure for improving the mobility of carriers presenting in an organic compound film by relaxation of an energy barrier will be described.

The technique of inserting a carrier injection layer contributes with respect to the relaxation of the energy barrier in the lamination structure. That is, by inserting a material that relaxes the energy barrier into an interface between the lamination structure having a large energy barrier, the energy barrier can be designed in a staircase pattern. Consequently, a carrier injection property from the electrode can be improved and a driving voltage can be reduced to a certain extent. However, a problem is caused that the number of organic interfaces is increased with increasing the number of layers. That is the reason why a single layer structure rather holds top data of driving voltage and power efficiency. In other words, by overcoming the problem, the lamination structure can achieve the driving voltage and power efficiency of the single layer structure with maintaining a merit (various types of materials can be stacked without complicated design of molecules) of the lamination structure.

In this embodiment, when an organic compound film comprising a plurality of functional regions is formed between a cathode and an anode of a light-emitting device, a structure having a mixed region, which is different from the conventional lamination structure having a distinct interface between each lamination layer, comprising a material which constitutes a first functional region and another material which constitutes a second functional region is formed between the first functional region and the second functional region.

This embodiment also includes the case where a material that is capable of converting triplet excitation energy into luminescence is added to the mixed region as a dopant. In addition, the mixed region may be formed to have a concentration gradient.

It is considered that, by applying such structure as described above, the energy barrier which is present between functional regions is reduced compared with the conventional structure, thereby enhancing the carrier injection property. That is, the energy barrier between functional regions is relaxed by forming the mixed region and, accordingly, the driving voltage can be reduced and decrease in luminance can be prevented.

From the foregoing, in the manufacture of a light-emitting device which at least includes a region (first functional region) which a first organic compound can develop function and a region (second functional region) which a second organic compound different from the substance constituting the first functional region can develop function and also of a light-emitting apparatus having the light-emitting device, a mixed region comprising the organic compound constituting the first functional region and the organic compound constituting the second functional region is fabricated between the first functional region and the second functional region.

In a film formation apparatus, an organic compound film having a plurality of functional regions can be formed in one deposition chamber, and a plurality of evaporation sources is provided therewith accordingly.

Figure 10A:
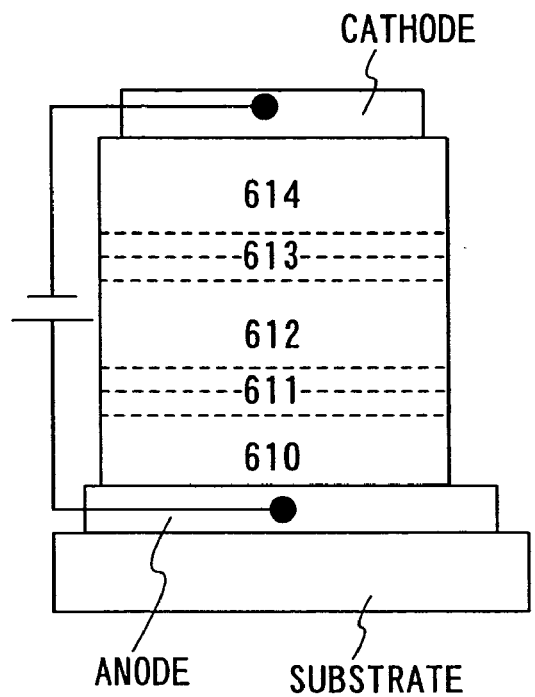
FIGS. 10A and 10B are block diagrams showing device structures according to Embodiment 2.

Firstly, a first organic compound is deposited. The first organic compound, which has previously been vaporized by resistance heating, is scattered in the direction of a substrate by opening a shutter at the time to start vapor deposition. Subsequently, a first functional region 610 shown in FIG. 10A is formed.

Next, while depositing the first organic compound, a first shutter is opened, and a second organic compound is deposited. Further, the second organic compound, which has also previously been vaporized by resistance heating, is scattered in the direction of the substrate by opening a second shutter at the time to start vapor deposition. Subsequently, a first mixed region 611 comprising the first organic compound and the second organic compound can be formed.

Then, after a while, only the first shutter is closed, and the second organic compound is deposited. Subsequently, a second functional region 612 can be formed.

Further, in this embodiment, the case that the mixed region is formed by depositing simultaneously two types of organic compounds is described. However, it is also possible that the second organic compound is deposited after depositing the first organic compound under the evaporation atmosphere of the first organic compound, and a mixed region is formed between the first functional region and the second functional region.

Next, while depositing the second organic compound, a third shutter is opened, and a third organic compound is deposited. Further, the third organic compound, which has also previously been vaporized by resistance heating, is scattered in the direction of the substrate by opening the shutter at the time to start vapor deposition. Subsequently, a second mixed region 613 comprising the second organic compound and the third organic compound can be formed.

Then, after a while, only the second shutter is closed, and the third organic compound is deposited. Subsequently, a third functional region 614 can also be formed.

Finally, a light-emitting device is completed by forming a cathode over the substrate.

Figure 10B:
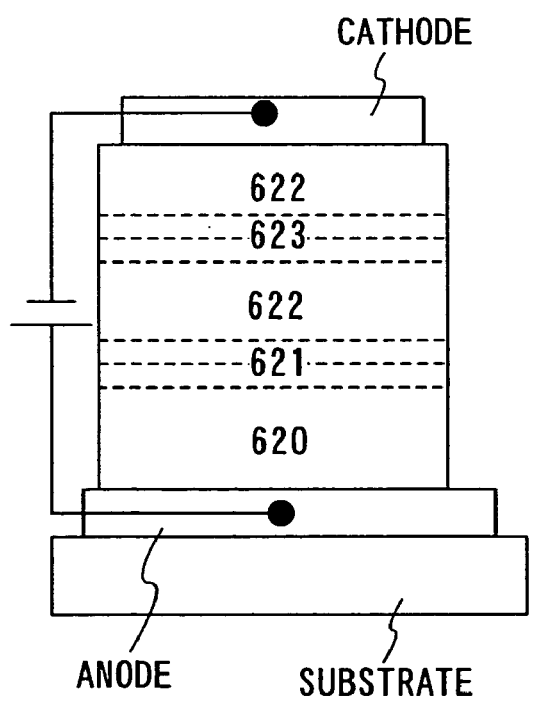

Further, as another organic compound films as shown in FIG. 10B, after forming a first functional region 620 by using the first organic compound, a first mixed region 621 comprising the first organic compound and a second organic compound is formed, and a second functional region 622 is formed by using the second organic compound. Thereafter, in the process of forming the second functional region 622, the third shutter is temporarily opened to deposit simultaneously a third organic compound. Subsequently, a second mixed region 623 is formed.

Then, after a while, the second functional region 622 is formed again by closing the third shutter. Thereafter, a cathode is formed over the substrate, thereby completing the light-emitting device.

Since an organic compound film having a plurality of functional regions can be formed in one deposition chamber, impurities can be prevented from contaminating the interface between the functional regions, and also, a mixed region can be formed at the interface between the functional regions. Therefore a light-emitting device having a plurality of functions can be fabricated without having distinct lamination structure (namely, without a distinct organic interface).

Further, when a film formation apparatus which can perform vacuum annealing before depositing, during depositing, or after depositing is used, intermolecular state in the mixed region can be more strong by vacuum annealing during the deposition. Accordingly, it becomes possible to reduce the driving voltage and prevent decreasing in luminance. Further, annealing (deaeration) may be carried out after deposition, as a result, impurities such as oxygen or moisture in the organic compound layer remained over the substrate can be further removed, and high-density and high-purity organic compound layer can be fabricated.

Further, this embodiment can be freely combined with any one of Embodiment Mode 1 to Embodiment Mode 9, or Embodiment 1.

Embodiment 3

By implementing the invention, various modules (active matrix type liquid crystal module, active matrix type EL module and active matrix type EC module) can be fabricated. That is, by implementing the invention, all of the electronic devices incorporated those modules can be completed.

As such electronic devices (electric appliances), a video camera, a digital camera, a head mount display (goggle type display), a car navigation, a projector, a car stereo, a personal computer, a portable information terminal (a mobile computer, a portable telephone, an electronic book, or the like) or the like can be given. FIGS. 11A to 12C show examples of these.

Figure 11A:
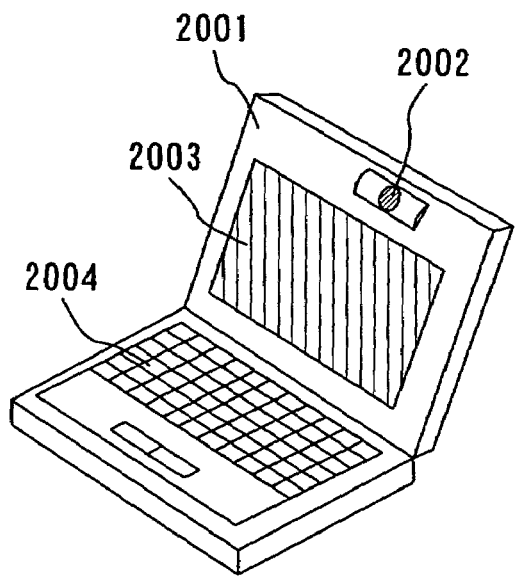
FIGS. 11A to 11E are diagrams showing examples of electronic devices according to Embodiment 3.

FIG. 11A is a personal computer which includes a main body 2001, an image input portion 2002, a display portion 2003, a keyboard 2004, or the like. The top surface regions (shapes) of the banks can be reduced according to the present invention, and aperture ratio increases so that high definition display can be realized.

Figure 11B:
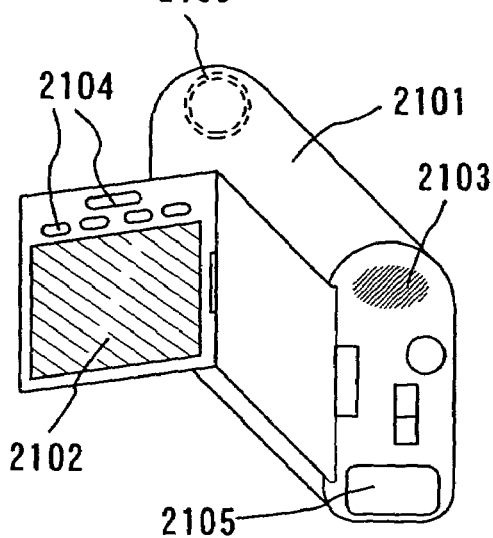

FIG. 11B is a video camera which includes a main body 2101, a display portion 2102, a voice input portion 2103, operating switches 2104, a battery 2105, an image receiving portion 2106, or the like. The top surface regions (shapes) of the banks can be reduced according to the present invention, and aperture ratio increases so that high definition display can be realized.

Figure 11C:
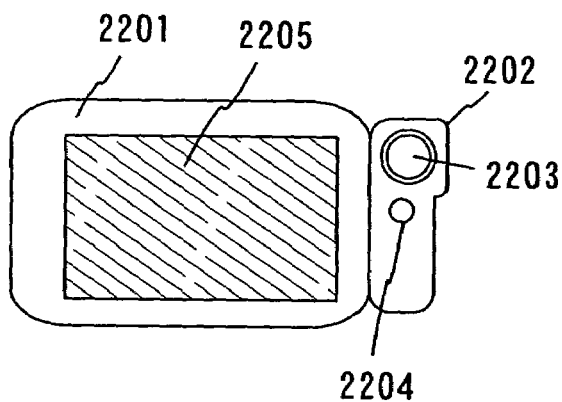

FIG. 11C is a mobile computer which includes a main body 2201, a camera portion 2202, an image receiving portion 2203, an operating switch 2204, a display portion 2205, or the like.

Figure 11D:
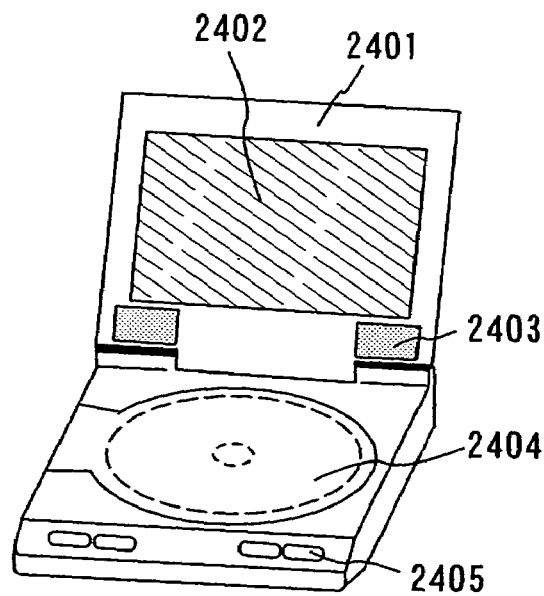

FIG. 11D is a player using a record medium recorded with programs (hereinafter, record medium) which includes a main body 2401, a display portion 2402, a speaker portion 2403, a record medium 2404, an operating switch 2405, or the like. Further, the player uses DVD (Digital Versatile Disc) or CD as a record medium and can be used for enjoying music, enjoying movie and carrying out the game or Internet.

Figure 11E:
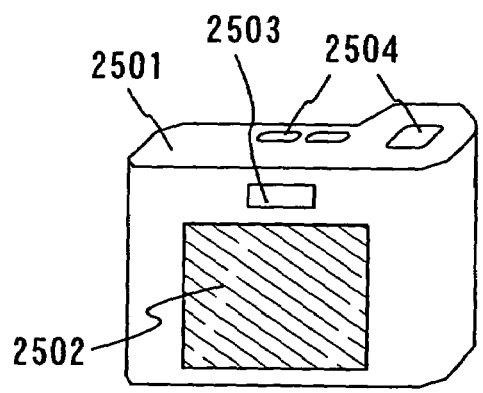

FIG. 11E is a digital camera which includes a main body 2501, a display portion 2502, an eye piece 2503, operating switches 2504, an image receiving portion (not shown), or the like. The top surface regions (shapes) of the banks can be reduced according to the present invention, and aperture ratio increases so that high definition display can be realized.

Figure 12A:
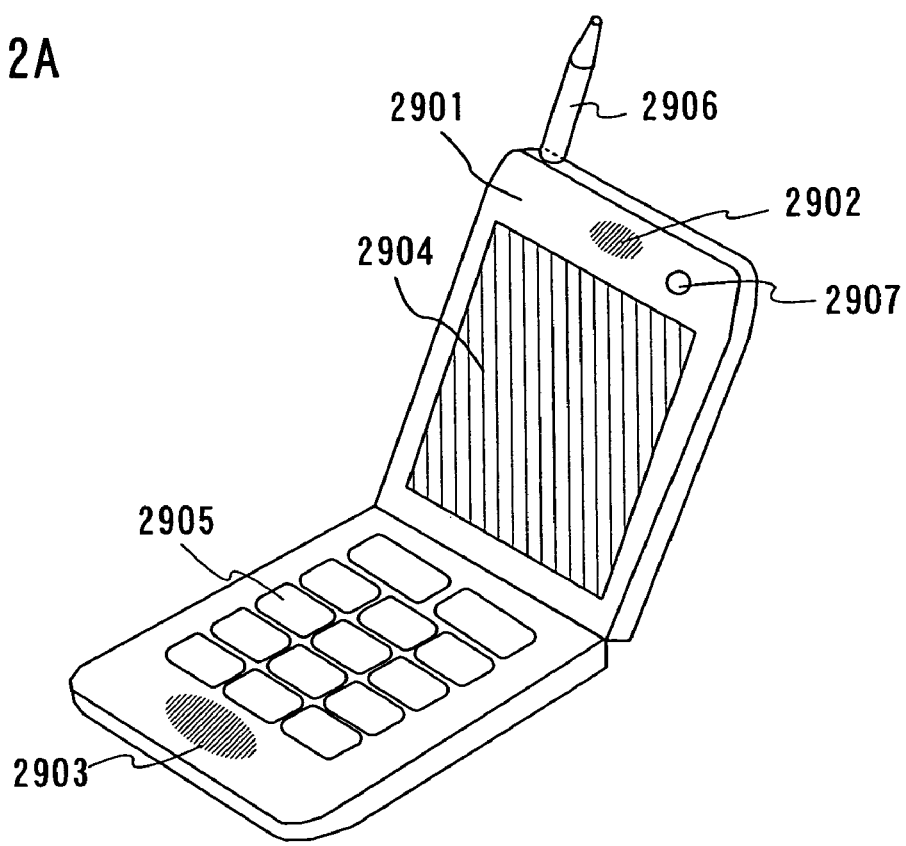
FIGS. 12A to 12C are diagrams showing examples of electronic device according to Embodiment 3.

FIG. 12A is a portable telephone which includes a main body 2901, a voice output portion 2902, a voice input portion 2903, a display portion 2904, an operating switch 2905, an antenna 2906, an image input portion (CCD, image sensor or the like) 2907, or the like. The top surface regions (shapes) of the banks can be reduced according to the present invention, and aperture ratio increases so that high definition display can be realized.

Figure 12B:
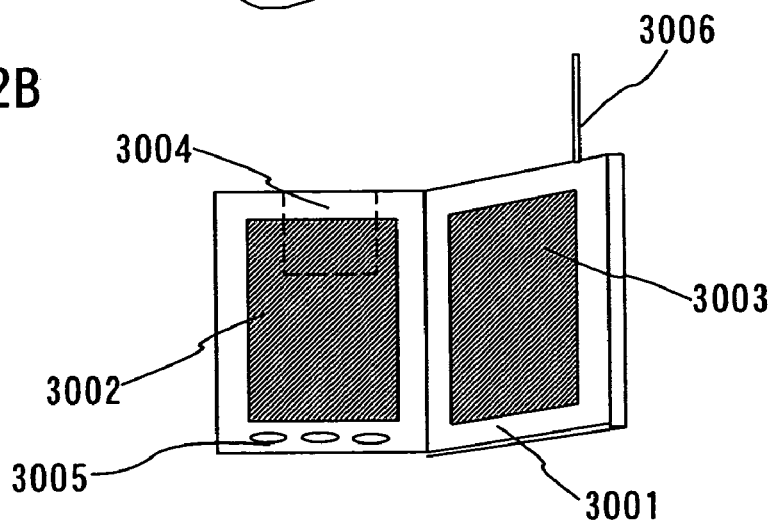

FIG. 12B is a portable book (electronic book) which includes a main body 3001, display portions 3002, 3003, a record medium 3004, an operating switch 3005, an antenna 3006, or the like. The top surface regions (shapes) of the banks can be reduced according to the present invention, and aperture ratio increases so that high definition display can be realized.

Figure 12C:
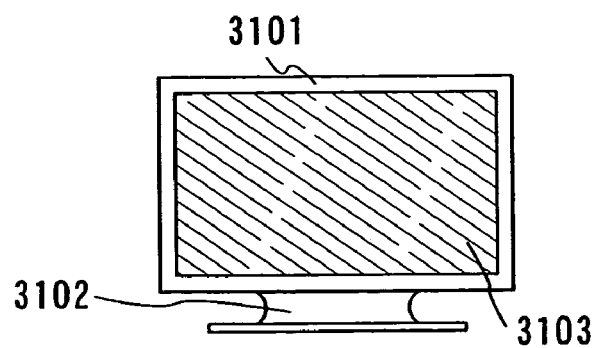

FIG. 12C is a display which includes a main body 3101, a support base 3102, a display portion 3103, or the like.

Incidentally, the display shown in FIG. 12C is of a screen size of middle or small type or large type, for example, a screen size from 5 to 20 inches. Further, in order to form the display portion of this size, it is preferable to use a display portion having a side length of a substrate of 1 m and carry out mass production by multiple patterns.

As described above, the range of applying the present invention is extremely wide and is applicable to a method of fabricating electronic devices of all fields. Further, the electronic devices of the embodiment can be realized by combining with any one of Embodiment Mode 1 to Embodiment Mode 9, Embodiment 1, or Embodiments 2.

Embodiment 4

The electronic devices described in Embodiment 3 equipped with a module with a panel including a sealed light-emitting device on which a controller and an IC including a circuit such as a power supply circuit are mounted. Both the module and the panel are one mode of the light-emitting apparatus. In the present Embodiment, a concrete structure of a module will be described.

Figure 13A:
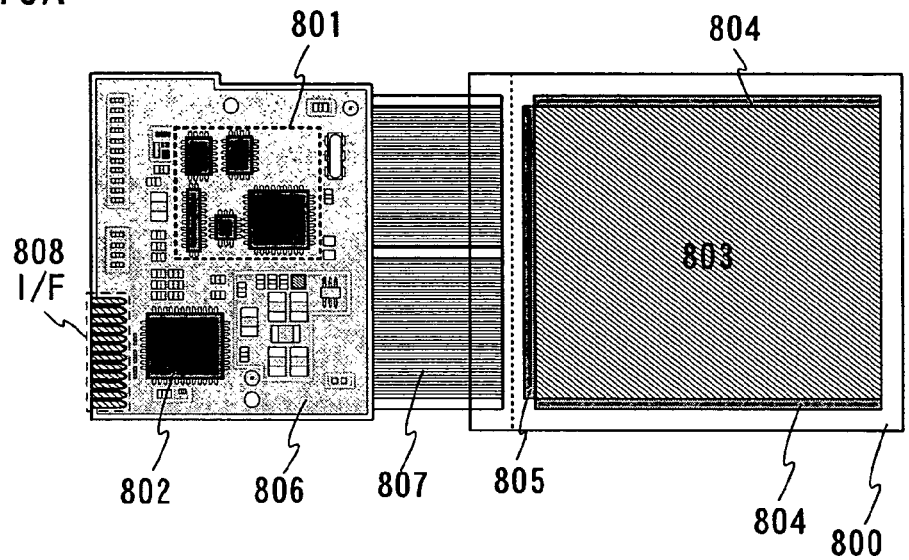
FIGS. 13A and 13B are views showing a module according to Embodiment 4.

FIG. 13A shows a schematic diagram of a module that includes a panel 800 on which a controller 801 and a power supply circuit 802 are mounted. The panel 800 is provided with a pixel portion 803 in which a light-emitting device is provided in each pixel, a scanning line drive circuit 804 for selecting a pixel in the pixel portion 803, and a source line drive circuit 805 for supplying a video signal to the selected pixel.

The controller 801 and the power supply circuit 802 are provided with a printed substrate 806, various kinds of signals and power supply voltage output from the controller 801 or the power supply circuit 802 are supplied via a FPC 807 to the pixel portion 803, the scanning line drive circuit 804, and the source line drive circuit 805 in the panel 800.

The power supply voltage and the various kind of signals are supplied to the printed circuit 806 via an interface (I/F) 808 in which a plurality of input terminals are arranged.

Although the printed substrate 806 is mounted on the panel 800 with FPC in this embodiment, the present invention is not limited to this structure. The controller 801 and the power supply circuit 802 may be provided directly on the panel 800 with COG (Chip on Class) method.

Further, in the printed circuit 806, there is a case that a capacitance formed between lead wirings and a resistance of a wiring itself cause a noise to a power supply voltage or a signal, or make a rise of a signal dull. Therefore it may be provided various kinds of devices such as a capacitor and a buffer to prevent the noise to the power supply voltage or a signal and the dull rise of the signal in the printed substrate 806.

Figure 13B:
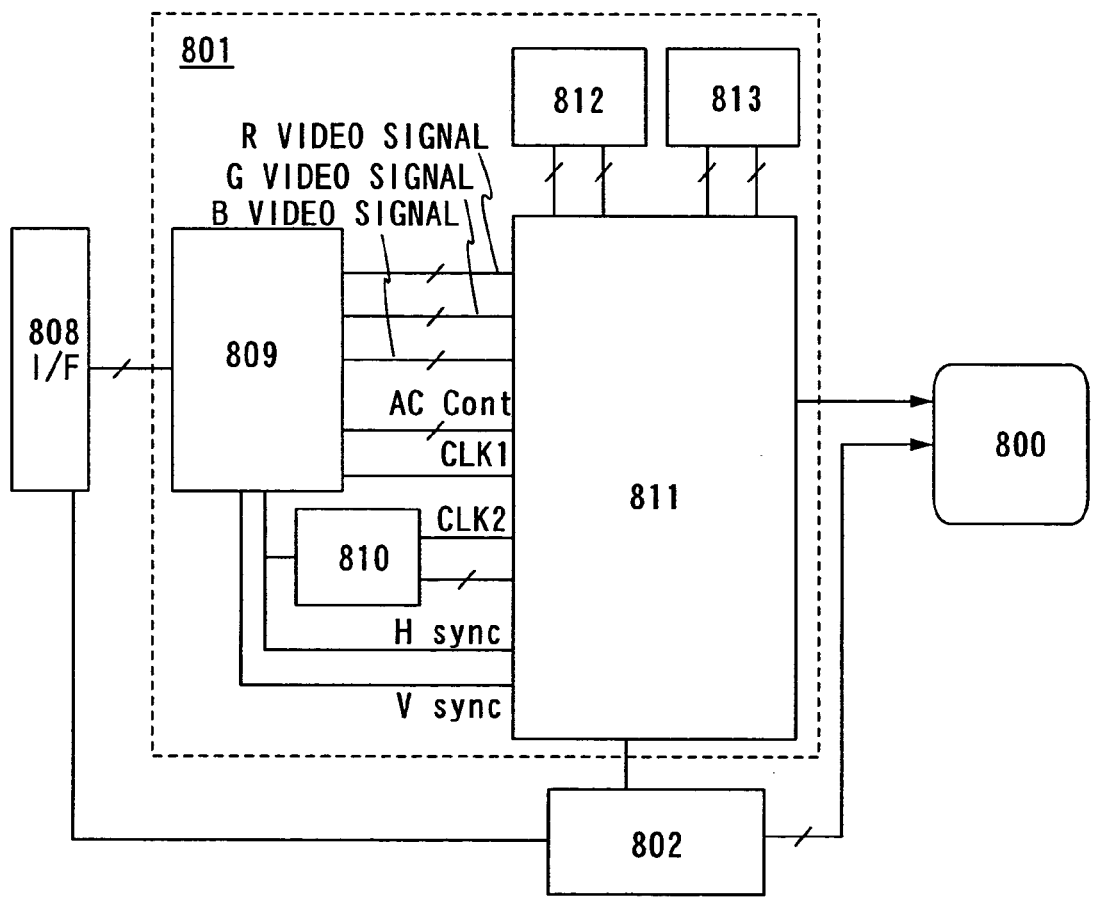

FIG. 13B is a block diagram showing a configuration of the printed substrate 806. Various kinds of signals and power supply voltage supplied to the interface 808 are supplied to the controller 801 and the power supply circuit 802.

The controller 801 has an A/D converter 809, a phase locked loop (PLL) 810, control-signal generating portion 811, and SRAMs (Static Random Access Memory) 812 and 813. Although the SRAM is used in this embodiment, instead of the SRAM, SDRAM can be used and DRAM (Dynamic Random Access Memory) can also be used if it is possible to write in and read out data at high speed.

Video signals supplied via the interface 808 are subjected to a parallel-serial conversion in the A/D converter 809 to be input into the control-signal generating portion 811 as video signals corresponding to respective colors of R, Q and B. Further, based on various kinds of signals supplied via the interface 808, Hsync signal, Vsync signal, clock signal CLK, and volts alternating current (AC cont) are generated in the A/D converter 809 to be input into the control signal generating portion 811.

The phase-locked loop 810 has a function to synchronize the phase of the frequency of each signal supplied through the interface 808 with the phase of the operating frequency of the control-signal generating portion 811. The operating frequency of the control-signal generating portion 811 is not necessarily the same as the frequency of each signal supplied through the interface 808, but adjust, in the phase-locked loop 810, the operating frequency of the control-signal generating portion 811 in a manner of synchronization with one another.

The video signal inputted to the control-signal generating portion 811 is once written into and held on the SRAM 812, 813. The control-signal generating portion 811 reads out the video signals corresponding to all the pixels, one bit by one bit, from among all the bits of video signals held on the SRAM 812, and supplies them to the source line drive circuit 805 in the panel 800.

The control signal generating portion 811 supplies the information concerning a period during which the light-emitting device of each bit emits luminescence, to the scanning-line drive circuit 804 in the panel 800.

The power supply circuit 802 supplies a predetermined power supply voltage to the source line drive circuit 805, scanning line drive circuit 804, and pixel portion 803 in the panel 800.

The structure of the power supply circuit 802 will be described in detail with reference to FIG. 14. The power supply circuit 802 of this embodiment comprises a switching regulator 854 using four switching regulator controls 860 and a series regulator 855.

Generally, a switching regulator that is small in size and light in weight as compared to a series regulator, can increase voltage and invert positive and negative besides decreasing voltage. On the other hand, the series regulator that is used only in decreasing voltage, has a well output voltage accuracy as compared to the switching regulator, hardly causing ripples or noises. The power supply circuit 802 of this embodiment mode uses a combination of the both.

Figure 14:
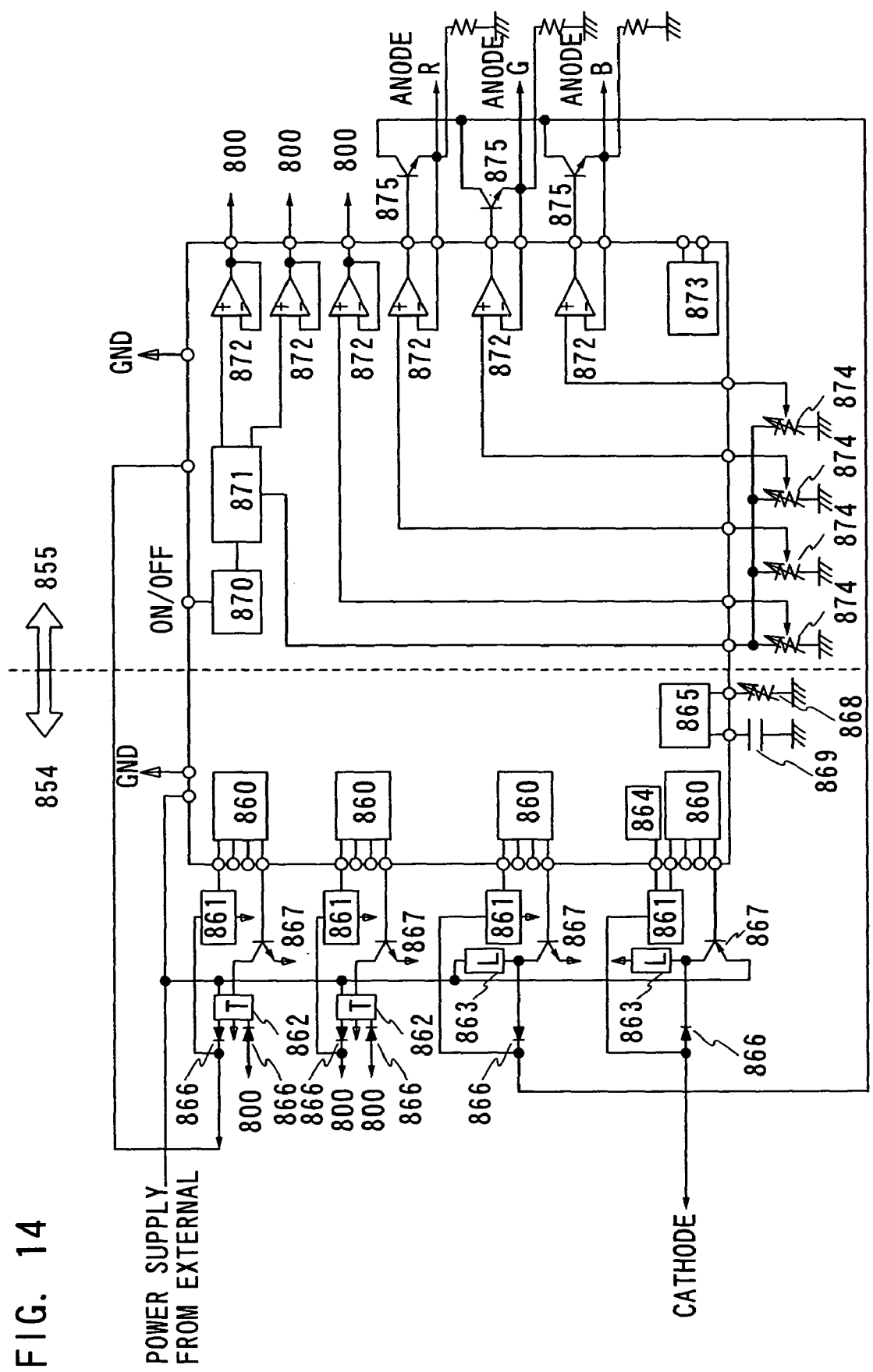
FIG. 14 is a block diagram of a power supply circuit according to Embodiment 4.

The switching regulator 854 shown in FIG. 14 has switching regulator controls (SWR) 860, attenuators (ATT) 861, transformers (T) 862, an inductor (L) 863, a reference power supply (Vref) 864, an oscillator circuit (OSC) 865, a diode 866, a bipolar transistor 867, a varistor 868, and a capacitance 869.

When a voltage of an external Li-ion battery (3.6 V) or the like is transformed in the switching regulator 854, a power supply voltage to be supplied to a cathode and a power supply voltage to be supplied to the switching regulator 854 are generated.

The series regulator 855 has a band-gap circuit (BG) 870, an amplifier 871, operational amplifiers 872, a current source 873, varistors 874 and a bipolar transistor 875, and is supplied with a power supply voltage generated at the switching regulator 854.

In the series regulator 855, a power supply voltage generated by the switching regulator 854 is used to generate a direct current power supply voltage to be supplied to a wiring (current supply line) for supplying current to anodes of each color of light-emitting devices according to a constant voltage generated by the band-gap circuit 870.

Incidentally, the current source 873 is used for a driving method to write video signal current to a pixel. In this case, the current generated by the current source 873 is supplied to the source line drive circuit 805 in the panel 800. In the case of a drive method to write the video signal voltage to a pixel, the current source 873 is not necessarily be provided.

It is possible that a switching regulator, an OSC, an amplifier and an operation amplifier is formed using TFT.

The structure of this embodiment may be freely combined with any of the structures of Embodiment Mode 1 to Embodiment Mode 8 and Embodiment 1 to Embodiment 3.

According to the present invention, poor coverage can be reduced by means of covering the side face or the upper surface of the first bank by a second bank even when a difference in level in the cross-sectional shape of a first bank is large. In addition, since the upper surface shape of a bank can be formed to be narrow, higher resolution can be realized.

Further, electrostatic discharge damage or adhesion of dust that is frequently seen in transporting a substrate between fabrication equipment or installation sites of the equipment can be prevented according to the present invention.

What is claimed is:

1. A light-emitting apparatus comprising:
   a substrate having an insulating surface;
   a light-emitting device formed over the substrate having a first electrode, an organic compound layer and a second electrode;
   a first bank covering an edge portion of the first electrode; and
   a second bank serving as a side wall of the first bank,
   wherein the first bank and the second bank are on and in contact with a same surface, and
   wherein the first bank is in contact with the organic compound layer.

2. A light-emitting apparatus according to claim 1, wherein a material for forming the first bank is different from that for forming the second bank.

3. A light-emitting apparatus according to claim 1, wherein a material for forming the first bank is an inorganic insulating material, and a material for forming the second bank is an organic insulating material.

4. A light-emitting apparatus according to claim 1, wherein a material for forming the first bank is a hydrophobic material, and a material for forming the second bank is a hydrophilic material.

5. A light-emitting apparatus according to claim 1, wherein irregularities on a first electrode surface in contact with the organic compound layer are smaller than those on a first electrode surface covered with the first bank.

6. A light-emitting apparatus according to claim 1, wherein irregularities on a region in contact with the second bank within the first electrode are smaller than those on a first electrode surface in contact with the first bank.

7. A light-emitting apparatus comprising:
   a substrate having an insulating surface;
   a light-emitting device formed over the substrate having a first electrode, an organic compound layer, and a second electrode;
   a third electrode electrically connecting to the first electrode;
   a first bank comprising an oxide, covering the third electrode formed below the second electrode; and
   a second bank serving as a side wall of the first bank,
   wherein the organic compound layer is formed over the first electrode and the second electrode is formed over the organic compound layer,
   wherein the first bank and the second bank are on and in contact with a same surface, and
   wherein the first bank is in contact with the organic compound layer.

8. A light-emitting apparatus according to claim 7, wherein irregularities on a first electrode surface in contact with the organic compound layer are smaller than those on a first electrode surface covered with the first bank.

9. A light-emitting apparatus according to claim 7, wherein irregularities on a region in contact with the second bank within the first electrode are smaller than those on a first electrode surface in contact with the first bank.

10. A light-emitting apparatus comprising:
a substrate having an insulating surface;
a light-emitting device formed over the substrate having a first electrode, an organic compound layer, and a second electrode;
a first bank covering all edge portion of the first electrode;
a second bank serving as a side wall of the first bank; and
a metal layer formed on the first bank,
wherein the first bank comprises an insulating layer, and
wherein the metal layer is in contact with the organic compound layer.

11. A light-emitting apparatus according to claim 10, wherein the second electrode has a transparent conductive film, and luminescence from the light-emitting device emits through the second electrode.

12. A light-emitting apparatus according to claim 10, wherein the metal layer serves as an auxiliary electrode in contact with the second electrode.

13. A light-emitting apparatus according to claim 10, wherein the metal layer connects to a bottom wiring via a contact hole provided with the bank.

14. A light-emitting apparatus comprising:
a substrate;
a first electrode;
a first bank partly covering the first electrode wherein an edge portion of the first electrode is covered by the first bank;
a second bank formed on a side surface of the first bank;
a light emitting layer comprising an organic material formed over the first electrode;
a second electrode formed over the light emitting layer, the first bank and the second bank,
wherein the first bank and the second bank are on and in contact with a same surface, and
wherein the first bank is in contact with the organic compound layer.

15. A light-emitting apparatus according to claim 14, wherein the light emitting layer extends over the second bank.

16. A light-emitting apparatus according to claim 14, wherein the light emitting layer contacts with a side surface of the second bank.

17. A light-emitting apparatus according to claim 14, wherein the light emitting layer extends over the second bank and a part of the first bank.

18. A light-emitting apparatus according to claim 14, further a metal layer formed on the first bank,
wherein the first bank comprises an insulating layer.

19. A light-emitting apparatus according to claim 14, wherein the second electrode has a transparent conductive film and luminescence from the light emitting layer emits through the second electrode.

20. A light-emitting apparatus according to claim 18, wherein the metal layer serves as an auxiliary electrode in contact with the second electrode.

21. A light-emitting apparatus according to claim 18, wherein the metal layer connects to a bottom wiring via a contact hole provided with the bank.

22. A light-emitting apparatus according to claim 14, wherein a material for forming the first bank is different from that for forming the second bank.

23. A light-emitting apparatus according to claim 14, wherein a material for forming the first bank is an inorganic insulating material, and a material for forming the second bank is an organic insulating material.

24. A light-emitting apparatus according to claim 14, wherein a material for forming the first bank is a hydrophobic material, and a material for forming the second bank is a hydrophilic material.

25. A light-emitting apparatus according to claim 14, wherein irregularities on a first electrode surface in contact with the light emitting layer are smaller than those on a first electrode surface covered with the first bank.

26. A light-emitting apparatus according to claim 14, wherein irregularities on a region in contact with the second bank within the first electrode are smaller than those on a first electrode surface in contact with the first bank.

27. A light-emitting apparatus comprising:
a substrate having an insulating surface;
a light-emitting device formed over the substrate comprising a first electrode, an organic compound layer and a second electrode;
a first bank formed over an edge portion of the first electrode; and
a second bank serving as a side wall of the first bank,
wherein the first bank is in contact with the second electrode.

28. A light-emitting apparatus according to claim 27, wherein the first bank and the second bank are on and in contact with a same surface.

29. A light-emitting apparatus according to claim 27, wherein the first bank is in contact with the organic compound layer.

30. A light-emitting apparatus according to claim 27, wherein a material for forming the first bank is different from that for forming the second bank.

31. A light-emitting apparatus according to claim 27, wherein a material for forming the first bank is a hydrophobic material, and a material for forming the second bank is a hydrophilic material.

32. A light-emitting apparatus comprising:
a substrate;
a first electrode;
a first bank formed over an edge portion of the first electrode;
a second bank formed on a side surface of the first bank;
a light emitting layer comprising an organic material formed over the first electrode;
a second electrode formed over the light emitting layer, the first bank and the second bank,
wherein the first bank is in contact with the second electrode.

33. A light-emitting apparatus according to claim 32, wherein the first bank and the second bank are on and in contact with a same surface.

34. A light-emitting apparatus according to claim 32, wherein the first bank is in contact with the organic compound layer.

35. A light-emitting apparatus according to claim 32, wherein a material for forming the first bank is different from that for forming the second bank.

36. A light-emitting apparatus according to claim 32, wherein a material for forming the first bank is a hydrophobic material, and a material for forming the second bank is a hydrophilic material.

37. A light-emitting apparatus comprising:
a substrate having an insulating surface;
a light-emitting device formed over the substrate comprising a first electrode, an organic compound layer, and a second electrode;
a third electrode electrically connecting to the first electrode;

a first bank comprising an oxide, covering the third electrode formed below the second electrode; and a second bank serving as a side wall of the first bank, wherein the organic compound layer is formed over the first electrode and the second electrode is formed over the organic compound layer, and wherein the first bank is in contact with the second electrode.

38. A light-emitting apparatus according to claim 37, wherein the first bank is in contact with the organic compound layer.

39. A light-emitting apparatus according to claim 37, wherein the first bank includes an oxide of the third electrode.

* * * * *